US010534128B2

(12) United States Patent
Otani

(10) Patent No.: US 10,534,128 B2
(45) Date of Patent: Jan. 14, 2020

(54) PULSED LASER DEVICE

(71) Applicant: FURUKAWA ELECTRIC CO., LTD., Tokyo (JP)

(72) Inventor: Eisuke Otani, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/836,023

(22) Filed: Dec. 8, 2017

(65) Prior Publication Data
US 2018/0106963 A1    Apr. 19, 2018

Related U.S. Application Data

(63) Continuation of application No. PCT/JP2016/067402, filed on Jun. 10, 2016.

(30) Foreign Application Priority Data

Jun. 10, 2015 (JP) .................................. 2015-117792
Sep. 9, 2015 (JP) .................................. 2018-177273

(51) Int. Cl.
H01S 5/0683 (2006.01)
H01S 3/10 (2006.01)
(Continued)

(52) U.S. Cl.
CPC ...... G02B 6/02052 (2013.01); H01S 3/06766 (2013.01); H01S 3/06783 (2013.01);
(Continued)

(58) Field of Classification Search
CPC ... G02B 6/02052; G02B 6/02; H01S 3/06758; H01S 3/10
See application file for complete search history.

(56) References Cited

U.S. PATENT DOCUMENTS 6,590,924 B2    7/2003  Fish et al.
6,885,683 B1    4/2005  Fermann et al.
(Continued)

FOREIGN PATENT DOCUMENTS

EP    0 665 446 A2    8/1995
EP    2 363 927 B1    11/2016
(Continued)

OTHER PUBLICATIONS

International Search Report dated Sep. 6, 2016 in PCT/JP2016/067402 filed Jun. 10, 2016 (with English Translation).
(Continued)

Primary Examiner — Sung H Pak
Assistant Examiner — Hoang Q Tran
(74) Attorney, Agent, or Firm — Oblon, McClelland, Maier & Neustadt, L.L.P.

(57) ABSTRACT

A pulsed laser device includes: a semiconductor laser device that outputs laser light having a single wavelength; a semiconductor optical amplifier that receives the laser light output from the semiconductor laser device and amplifies the laser light to output; and a semiconductor-optical-amplifier driver that supplies a pulse-modulated semiconductor-optical-amplifier driving current to the semiconductor optical amplifier.

24 Claims, 17 Drawing Sheets

(51) Int. Cl.
 *G02B 6/02* (2006.01)
 *H01S 5/026* (2006.01)
 *H01S 3/067* (2006.01)

(52) U.S. Cl.
 CPC .............. *H01S 3/10* (2013.01); *H01S 5/026* (2013.01); *H01S 3/0677* (2013.01)

(56) References Cited

U.S. PATENT DOCUMENTS

| | | | |
|---|---|---|---|
| 7,167,300 | B2 | 1/2007 | Fermann et al. |
| 7,206,329 | B2 | 4/2007 | Nakatsuka et al. |
| 7,672,552 | B2 | 3/2010 | Leuchs et al. |
| 7,688,499 | B2 | 3/2010 | Fermann et al. |
| 7,925,128 | B2 | 4/2011 | Ramachandran |
| 8,000,570 | B2 | 8/2011 | Digiovanni et al. |
| 8,031,396 | B2 | 10/2011 | Fermann et al. |
| 8,072,678 | B2 | 12/2011 | Fermann et al. |
| 8,103,142 | B2 | 1/2012 | Ramachandran et al. |
| 8,412,015 | B2 | 4/2013 | Digiovanni et al. |
| 8,520,299 | B2 | 8/2013 | Digiovanni et al. |
| 8,570,646 | B2 | 10/2013 | Fermann |
| 2003/0095736 | A1* | 5/2003 | Kish, Jr. ............... B82Y 20/00 385/14 |
| 2008/0018943 | A1 | 1/2008 | Eyal et al. |
| 2008/0180787 | A1* | 7/2008 | DiGiovanni ....... G02B 6/02019 359/334 |
| 2013/0033742 | A1 | 2/2013 | Rogers et al. |
| 2013/0250979 | A1* | 9/2013 | Muendel ............... H01S 5/0092 372/20 |

FOREIGN PATENT DOCUMENTS

| | | |
|---|---|---|
| JP | 58-48513 | 3/1983 |
| JP | 3-221927 | 9/1991 |
| JP | 3-242627 | 10/1991 |
| JP | 7-183621 | 7/1995 |
| JP | 2002-118315 | 4/2002 |
| JP | 2005-175021 | 6/2005 |
| JP | 2005-217235 | 8/2005 |
| JP | 2006-49491 | 2/2006 |
| JP | 2007-5704 | 1/2007 |
| JP | 2007-194416 | 8/2007 |
| JP | 4232130 | 3/2009 |
| JP | 2009-541091 | 11/2009 |
| JP | 2010-192651 | 9/2010 |
| JP | 2011-181761 | 9/2011 |
| JP | 5250564 | 7/2013 |
| JP | 2013-205556 | 10/2013 |
| JP | 2014-033127 A | 2/2014 |
| JP | 2014-135351 | 7/2014 |
| WO | WO 2007/149208 A2 | 12/2007 |
| WO | WO 2008/097958 A1 | 8/2008 |

OTHER PUBLICATIONS

Written Opinion dated Sep. 6, 2016 in PCT/JP2016/067402 filed Jun. 10, 2016.
Thomas Sosnowski, et al., "3C Yb-doped Fiber Based High Energy and Power Pulsed Fiber Lasers", Proc. SPIE 8601, Fiber Lasers X: Technology, Systems, and Applications, doi: 10.1117/12.2008306, Mar. 22, 2013, 12 pages.
Office Action issued in corresponding German Application No. 11 2016 002 585.8 dated Sep. 26, 2019, (with English translation).

* cited by examiner

2ns/div

2ns/div

US 10,534,128 B2

PULSED LASER DEVICE

CROSS-REFERENCE TO RELATED APPLICATION(S)

This application is based on a continuation of International Application No. PCT/JP2016/067402, filed on Jun. 10, 2016, which claims the benefit of priority of the prior Japanese Patent Application Nos. 2015-117792, filed on Jun. 10, 2015, and 2015-177273, filed on Sep. 9, 2015, the entire contents of which are incorporated herein by reference.

BACKGROUND

The present disclosure relates to a pulsed laser device.

In the related art, pulsed laser devices of, so called, Master Oscillator Power Amplifier (MOPA) type that output high power pulsed laser light by amplifying a seed light source that outputs pulsed laser light as seed light with an optical amplifier, such as an optical fiber amplifier, have been disclosed (refer to Japanese Laid-Open Patent Publication No. 2002-118315). This type of pulsed laser device is used for laser processing or the like.

On the other hand, a technique of enhancing the extinction ratio in pulsed laser devices has been disclosed. The extinction ratio refers to a ratio of a power of light that is output when output of optical pulse is ON state to a power of light that is output when the output of optical pulse is OFF state. For example, Japanese Patent No. 4232130 discloses that optical pulse with high extinction ratio can be easily obtained by oscillating optical pulse having a pulse width of the order of 10 to 20 ns by current control of a DFB semiconductor laser, and by temporally extracting only a part of the optical pulse by an optical modulator, such as an Acousto-Optic Modulator (AOM), to modulate into an optical pulse having a pulse width of 1 ns. Moreover, Japanese Laid-Open Patent Publication No. 2010-192651 discloses that the extinction ratio can be enhanced by using an Electro-Optic Modulator (EOM) as the optical modulator, and by combining with a ring path constituted of a 2×2 optical switch to make light pass through the EOM twice. Furthermore, Japanese Laid-Open Patent Publication No. 2013-205556 discloses that the extinction ratio can be enhanced by combining a CW laser light source with the AOM and the EOM to generate an optical pulse. Furthermore, reference is made to U.S. Pat. No. 6,590,924.

SUMMARY

There is a need for providing a pulsed laser device capable of outputting pulsed laser light having a favorable pulse waveform.

According to an embodiment of the present disclosure, a pulsed laser device includes: a semiconductor laser device that outputs laser light having a single wavelength; a semiconductor optical amplifier that receives the laser light output from the semiconductor laser device and amplifies the laser light to output; and a semiconductor-optical-amplifier driving unit that supplies a pulse-modulated semiconductor-optical-amplifier driving current to the semiconductor optical amplifier.

DETAILED DESCRIPTION

In the related art, in a case where a semiconductor laser device, such as a DFB laser, is applied as a seed light source, a surge occurs in a pulse waveform (also called as "pre-pulse") when pulsed laser light having a pulse width of the order of nanoseconds is output, and there is a problem that, for example, it is impossible to output a pulsed laser light having a fine pulse waveform without pre-pulse. When the pre-pulse occurs, a peak power of pulsed laser light becomes greater than a predetermined value. Therefore, there is a possibility of causing various problems, such as damage to optical parts, damage to processing target when applied to laser processing, impossibility of obtaining good processing condition, and inability of obtaining a desirable output due to non-linear phenomenon.

Furthermore, the modulation rate of AOM is such that a pulse width of several ns can be obtained. It is practically difficult to obtain a pulse width of the order of 1 ns. Moreover, with the EOM, a sufficient extinction ratio cannot be obtained, and a complicated structure as in Japanese Laid-Open Patent Publication Nos. 2010-192651 and 2013-205556 is necessary to obtain a sufficient extinction ratio. In addition, with either of the AOM and EOM, some amount of an optical insertion loss is generated. Thus, in the related art, it has been difficult to obtain short pulsed light of the order of, for example, 1 ns to 2 ns with high extinction ratio. Therefore, it has been sometimes impossible to output a pulsed laser light having a favorable pulse waveform with high extinction ratio.

Embodiments of a pulsed laser device according to the present disclosure are explained in detail below with reference to the drawings. The embodiments are not intended to limit the present disclosure. Moreover, the same reference symbols are used to describe the same or equivalent elements throughout the drawings.

First Embodiment

Figure 1:
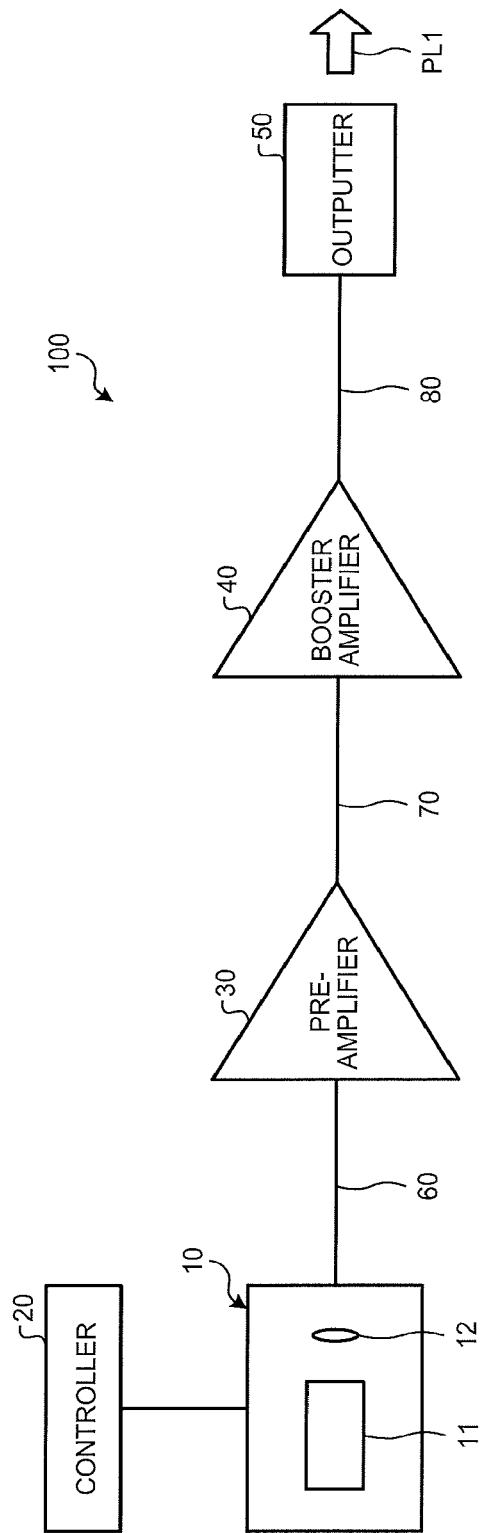
FIG. 1 is a schematic configuration diagram of a pulsed laser device according to a first embodiment.

FIG. 1 is a schematic configuration diagram of a pulsed laser device according to a first embodiment. As illustrated in FIG. 1, a pulsed laser device 100 includes a seed light source 10, a control unit (controller) 20, a preamplifier 30, a booster amplifier 40, an output unit 50, and single-mode optical fibers 60, 70, 80 that connect the seed light source 10, the preamplifier 30, the booster amplifier 40, and the output unit (outputter) 50 with each other. The pulsed laser device 100 outputs pulsed laser light PL1 from the output unit 50.

The seed light source 10 includes an integrated-semiconductor laser device 11 that outputs laser light, and a coupling lens system 12 that couples the laser light output from the integrated-semiconductor laser device 11 with the single-mode optical fiber 60.

Figure 2:
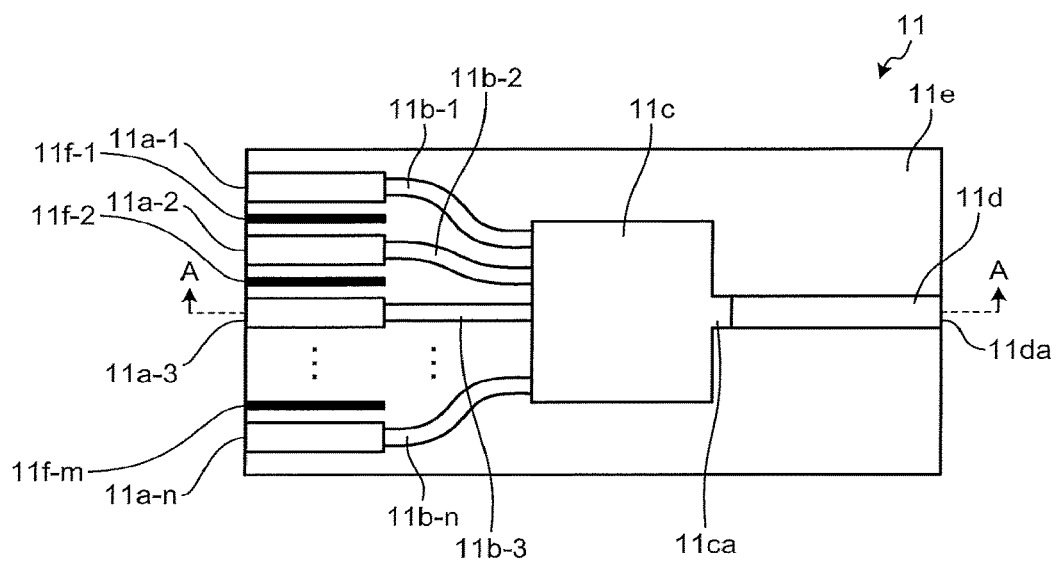
FIG. 2 is a schematic configuration diagram of an integrated-semiconductor laser device.

FIG. 2 is a schematic configuration diagram of the integrated-semiconductor laser device 11. The integrated-semiconductor laser device 11 has a structure in which plural DFB laser stripes 11a-1 to 11a-n (n is a positive integer equal to or greater than 2 and is, for example, 12) each of which is a semiconductor laser device that outputs laser light of a single wavelength, an MMI optical coupler 11c, and a Semiconductor Optical Amplifier (SOA) 11d that receives the laser light output from the DFB laser stripes 11a-1 to 11a-n and amplifies it are monolithically integrated on a single semiconductor substrate, and an embedding portion 11e is formed around these parts. Moreover, between the DFB laser stripes 11a-1 to 11a-n, trench grooves 11f-1 to 11f-m (m=n−1) for electrically separating the respective DFB laser stripes are arranged. Although a form in which multiple DFB laser stripes are provided is explained herein, just one DFB laser stripe can be provided. In this case, the trench groove is not necessary. When the DFB laser stripes 11a-1 to 11a-n are not distinguished from each other, they may be referred to as "DFB laser stripe 11a".

The DFB laser stripes 11a-1 to 11a-n are edge emitting lasers each of which has an embedding structure in a stripe having a width of 1.3 to 2.5 μm and a length of 1200 μm, and are formed at 25 μm pitch in a direction of width at an end opposite to an output end 11da on a light emission side of the integrated-semiconductor laser device 11. The pitch of the DFB laser stripes is designed to be small within a range of manufacturing precision of trench grooves and electrodes.

The DFB laser stripes 11a-1 to 11a-n are formed such that wavelengths of output laser light differ from each other within a range of 1550 nm band (for example, 1530 nm to 1570 nm) at intervals of, for example, 3.5 nm to 4 nm by varying pitches of a diffraction grating that is provided in each of the DFB laser stripes 11a-1 to 11a-n.

Optical waveguides 11b-1 to 11b-n are formed between the DFB laser stripes 11a-1 to 11a-n and the MMI optical coupler 11c, and optically connect the DFB laser stripes 11a-1 to 11a-n and the MMI optical coupler 11c.

The semiconductor optical amplifier 11d is connected to an output port 11ca of the MMI optical coupler 11c. The semiconductor optical amplifier 11d has a striped-embedding structure with a width of 1.3 μm to 4.0 μm and a length of 1500 μm (500 μm to 2000 μm). Moreover, the semiconductor optical amplifier 11d can have a flare structure in which the widths of stripes gradually increases as they approach the output end 11da.

Figure 3:
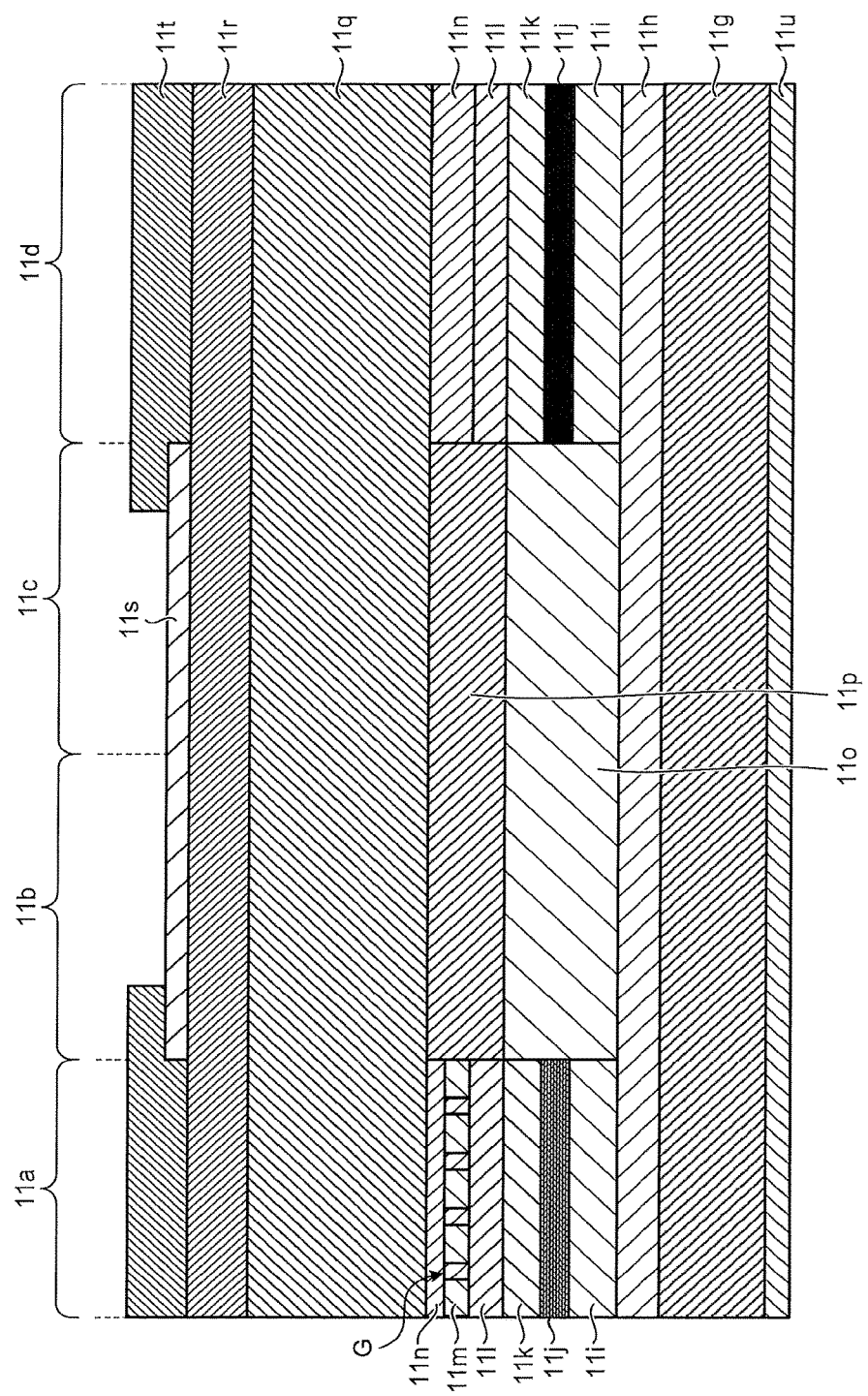
FIG. 3 is a vertical cross-sectional view taken along a line A-A in FIG. 2.

FIG. 3 is a vertical cross-section taken along a line A-A in FIG. 2. As illustrated in FIG. 3, the DFB laser stripe 11a has a structure in which an n-type InP buffer layer 11h that also serves as a lower cladding layer, a lower InGaAsP-SCH layer 11i, an active layer 11j having a multi-quantum well active layer constituted of InGaAsP, an upper InGaAsP-SCH layer 11k, an InP spacer layer 11l, an InGaAsP grating layer 11m in which a diffraction grating G is formed, and a p-type InP cladding layer 11n are sequentially stacked on an n-type InP substrate 11g. To a depth reaching a middle of the n-type InP buffer layer 11h from the p-type InP cladding layer 11n, there is a mesa structure constituting the DFB laser stripe 11a. Both sides in a direction of width of the mesa structure are embedded in a layered structure of a p-type InP current blocking layer and an n-type current blocking layer that constitute the embedding portion 11e.

Furthermore, the DFB laser stripe 11a has a p-type InP cladding layer 11q and an InGaAs contact layer 11r that are sequentially formed on the p-type InP cladding layer 11n and the n-type current blocking layer. An SiN protection layer 11s is formed so as to cover a surface of the InGaAs contact layer 11r and an internal surface of the trench groove. At a position corresponding to the DFB laser stripe 11a on an upper surface of the InGaAs contact layer 11r, an opening is formed that is not covered by the SiN protection layer 11s. A p-side electrode 11t is formed to be in contact with the InGaAs contact layer 11r at this opening. The integrated-semiconductor laser device 11 further includes an n-side electrode 11u that is formed on a rear side of the n-type InP substrate 11g.

The MMI optical coupler 11c has a structure in which the n-type InP buffer layer 11h, an InGaAsP core layer 11o, and an i-type InP layer 11p are sequentially stacked on the n-type InP substrate 11g. The composition of the InGaAsP constituting the InGaAsP core layer 11o is determined such that the bandgap wavelength is shorter than a laser oscillation wavelength of the DFB laser stripe 11a. Moreover, the MMI optical coupler 11c also has an embedding mesa structure similar to that of the DFB laser stripe 11a.

Furthermore, the MMI optical coupler 11c has the p-type InP cladding layer 11q, the InGaAs contact layer 11r, and the SiN protection layer 11s that are sequentially formed on the i-type InP layer 11p and the n-type current blocking layer. The SiN protection layer 11s is formed to cover the upper surface of the InGaAs contact layer 11r of the MMI optical coupler 11c entirely.

Each of the optical waveguides 11b-1 to 11b-n also has a similar structure as the MMI optical coupler 11c. However, in the MMI optical coupler 11c, the core width (mesa width) of the InGaAsP core layer 11o is determined to function as the MMI optical coupler 11c. On the other hand, in the optical waveguides 11b-1 to 11b-n, the core width (mesa width) of the corresponding InGaAsP core layer 11o is determined to propagate laser light that is output by the DFB laser stripe 11a in a single mode.

The semiconductor optical amplifier 11d has a layered structure and an embedding mesa structure similarly to the DFB laser stripe 11a. However, there is a difference that the InGaAsP grating layer 11m is not stacked in the semiconductor optical amplifier 11d.

Figure 4:
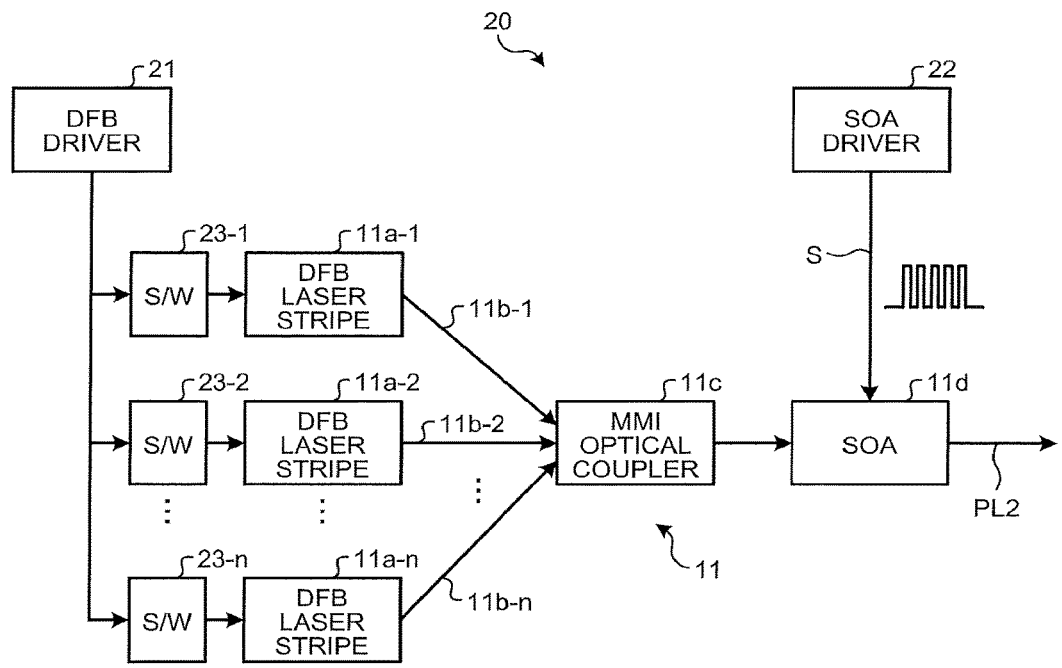
FIG. 4 is a schematic configuration diagram of a part related to an integrated-semiconductor laser device and a control unit.

FIG. 4 is a schematic configuration diagram of a part related to the integrated-semiconductor laser device 11 and the control unit 20. The control unit 20 includes a DFB driving unit (DFB driver) 21 serving as a semiconductor-laser-device driving unit (semiconductor-laser-device driver) that is formed to supply driving current to the DFB laser stripes 11a-1 to 11a-n, and an SOA driving unit (SOA driver) 22 serving as a semiconductor-optical-amplifier driving unit (semiconductor-optical-amplifier driver) that supplies a pulse-modulated driving current S to the semiconductor optical amplifier 11d as a semiconductor-optical-amplifier driving current. Furthermore, the control unit 20 includes plural switch units (switch, S/W) 23-1 to 23-n to switch between supply and stop of the driving current to the DFB laser stripes 11a-1 to 11a-n from the DFB driving unit 21. The switch units 23-1 to 23-n are arranged in a middle of supply paths of the driving current to the DFB laser stripes 11a-1 to 11a-n from the DFB driving unit 21, respectively. The switch units 23-1 to 23-n may be formed with an analog switching circuit, or may be formed by providing a zero-ohm resister to a switch unit that is connected to the DFB laser stripe to which the driving current is to be supplied, and by releasing the supply path for a switch unit that is connected to the DFB laser stripe to which the driving current is not to be supplied, or by providing a resister with high resistance value at a level enabled to exert the same effect as releasing.

When one or more out of the DFB laser stripes 11a-1 to 11a-n are supplied with a DC current through one or more out of the switch units 23-1 to 23-n by the DFB driving unit 21, the DFB laser stripe supplied with the driving current makes laser oscillation and outputs CW laser light. The wavelength of the laser light output by the DFB laser stripes 11a-1 to 11a-n can be adjusted by adjusting an amount of the driving current supplied to the respective stripes. For example, when the driving current is increased, the temperature of the DFB laser stripe increases, and the wavelength of laser light shifts toward a long wavelength side.

Subsequently, the MMI optical coupler 11c couples (just pass when input laser light is one) plural laser light beams that are input through one or more out of the optical waveguides 11b-1 to 11b-n and outputs it to the semiconductor optical amplifier 11d. The semiconductor optical amplifier 11d receives and amplifies the laser light and outputs it.

Directly modulated and driven by being supplied with the pulse-modulated driving current S from the SOA driving unit 22, the semiconductor optical amplifier 11d outputs the received CW laser light as a pulsed laser light PL2. The pulse width and the duty ratio of the pulsed laser light PL2 can be adjusted by adjusting the pulse width and the duty ratio of the driving current S. When the pulsed laser light PL2 has a pulse width of a nanosecond order, even if the semiconductor optical amplifier 11d is driven by a pulse-modulated driving current, the pulsed laser light PL2 is to have a favorable pulse waveform.

In the following, explanation is given referring to FIG. 1. In the seed light source 10, the coupling lens system 12 couples the pulsed laser light PL2 output from the semiconductor optical amplifier 11d of the integrated-semiconductor laser device 11 to the single-mode optical fiber 60. The single-mode optical fiber 60 propagates the pulsed laser light PL2 in a single mode, which is a fundamental mode, to input to the preamplifier 30.

The preamplifier 30 serving as an optical fiber amplifier is a publicly-known optical fiber amplifier that has an optical amplification effect on light having the wavelength of the pulsed laser light PL2, such as a rare-earth-doped optical fiber amplifier doped with, for example, erbium. The preamplifier 30 receives the pulsed laser light PL2 and amplifies it to output to the single-mode optical fiber 70. The single-mode optical fiber 70 propagates the amplified pulsed laser light PL2 in a single mode, which is a fundamental mode, to input to the booster amplifier 40.

The booster amplifier 40 serving as a booster optical-fiber amplifier is preferably an optical fiber amplifier that has a higher maximum output than the preamplifier, and receives the amplified pulsed laser light PL2 and further amplifies this to output to the single-mode optical fiber 80. The single-mode optical fiber 80 propagates the further amplified pulsed laser light PL2 in a single mode, which is a fundamental mode. The output unit 50 includes a publicly-known laser head having a lens, such as a condenser lens and a collimator lens, and outputs the further amplified pulsed laser light PL2 that has been propagated by the single-mode optical fiber 80 as a pulsed laser light PL1. When the pulsed laser device 100 is used for laser processing, the pulsed laser light PL1 is condensed to a processing target by the condenser lens of the output unit 50, to be used for desirable process operation.

As explained above, the pulsed laser device 100 uses the pulsed laser light PL2 having a favorable pulse waveform as seed light, and therefore, can output the pulsed laser light PL1 having a favorable pulse waveform. Thus, damage to optical parts or damage to processing target can be suppressed, and a good processing condition can be obtained.

Furthermore, by changing the DFB laser stripes 11a-1 to 11a-n to be driven, the wavelength of the pulsed laser light PL1 can be easily modified.

Moreover, when causing more than one out of the DFB laser stripes 11a-1 to 11a-n to output laser light beams, the optical power of each laser light decreases. Therefore, occurrence of the non-linear optical effect in an optical fiber following the seed light source 10, particularly, the booster amplifier 40 or the single-mode optical fiber 80, can be suppressed. Furthermore, it is possible to easily obtain the pulsed laser light PL2 in a state in which multiple laser light beams having different wavelength are synchronized without synchronization deviation.

Furthermore, generally, focal length of lens may vary depending on the wavelength of light. Therefore, when the pulsed laser device 100 is used for laser processing, if the wavelength of the pulsed laser light PL1 is changed by changing the DFB laser stripes 11a-1 to 11a-n to be driven after aligning the laser light PL1 with respect to a processing target, the focal position of the pulsed laser light PL1 by the condenser lens of the output unit 50 can be flexibly changed. For example, after focusing on a processing target with the pulsed laser light PL1 having a wavelength with the shortest focal length by the condenser lens, by processing while sequentially switching to the pulsed laser light PL1 having a wavelength with a longer focal length according to a process depth, it is possible to process efficiently or to obtain a favorable processed shape. Alternatively, by having multiple laser light beams with different wavelength be output from the DFB laser stripes 11a-1 to 11a-n, laser light components with multiple focal positions are included at the same time in the pulsed laser light PL1, and therefore, it is possible to process efficiently or to obtain a favorable processed shape. A difference in focal position of laser light components acquired by the pulsed laser device 100 is, for example, about one hundred to several hundred nm. Furthermore, by using a condenser lens having larger chromatic aberration in the output unit 50, a larger difference in focal position can be obtained.

Figure 5:
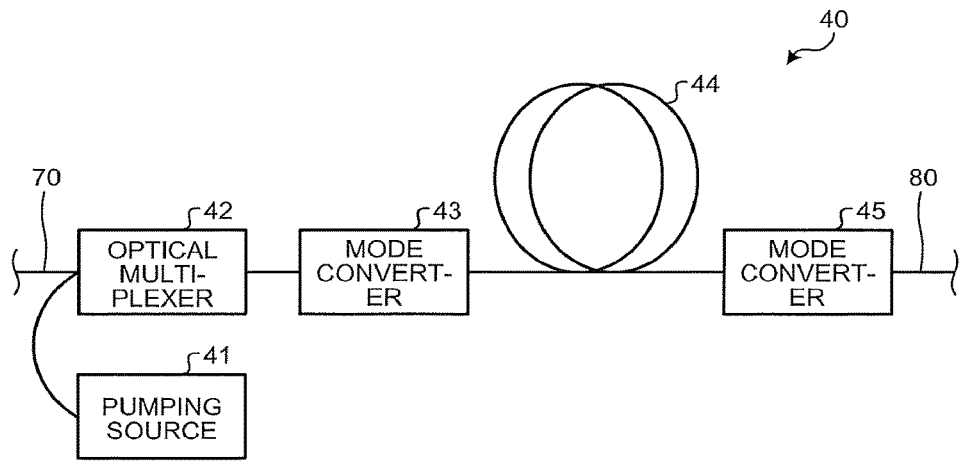
FIG. 5 is a schematic configuration diagram illustrating configuration example 1 of a booster amplifier.

FIG. 5 is a schematic configuration diagram illustrating first configuration example 1 of the booster amplifier. The booster amplifier 40 includes a pumping source 41, an optical multiplexer 42, a mode converting unit (mode converter) 43 serving as an effective-mode cross-section expanding unit (effective-mode cross-section expander), an optical amplification fiber 44 serving as an effective-mode cross-section-expanding optical-amplification fiber, and a mode converting unit (mode converter) 45 serving as an effective-mode cross-section reducing unit (effective-mode cross-section reducer).

The pumping source 41 outputs a pumping light to be supplied to the optical amplification fiber 44. The pumping source 41 includes, for example, a cascade Raman laser that outputs laser light having a power of several tens of watts class and having a 1.48 μm wavelength band (for example, 1.4 μm to 1.49 μm) that is a wavelength capable of pumping erbium as pumping light.

The optical multiplexer 42 multiplexes the pulsed laser light PL2 that has been propagated by the single-mode optical fiber 70 in the fundamental mode and the pumping light, to output to the mode converting unit 43, and includes, for example, a WDM coupler or a Tapered Fiber Bundle (TFB).

The mode converting unit 43 is, for example, a long-period grating disclosed in Japanese Patent No. 5250564, and expands an effective-mode cross-sectional area of the pulsed laser light PL2 and the pumping light by converting the propagation mode of the accepted pulsed laser light PL2 and the pumping light from the fundamental mode (LP01 mode) to a Higher Order Mode (HOM).

The optical amplification fiber 44 is, for example, an optical fiber disclosed in Japanese Patent No. 5250564, and is a rare-earth-doped optical fiber doped with, for example, erbium exerting an optical amplification effect with respect to light having the wavelength of the pulsed laser light PL2. The optical amplification fiber 44 amplifies the pulsed laser light PL2 in the higher order mode while propagating in the single mode by the optical amplification effect of a rare earth element optically pumped by the pumping light, and outputs it to the mode converting unit 45. Thus, the pulsed laser light PL2 propagates in the optical amplification fiber 44 while being amplified in a state in which the effective-mode cross sectional area is expanded, and therefore, an occurrence of the non-linear optical phenomenon in the optical amplification fiber 44 due to the pulsed laser light PL2 is suppressed. The effective-mode cross-sectional area of the pulsed laser light PL2 propagating in the optical amplification fiber 44 is, for example, 1677 μm$^2$ when the higher order mode is the LP010 mode, and is significantly greater than, for example, 55 μm$^2$ that is the effective-mode cross-sectional area in the case of a standard single-mode optical fiber used in optical fiber communications.

The mode converting unit 45 is, for example, a long-period grating disclosed in Japanese Patent No. 5250564, and receives the pulsed laser light PL2 that has propagated in the optical amplification fiber 44 in the higher order mode, converts the propagation mode into the fundamental mode, and outputs to the single-mode optical fiber 80. Thus, the pulsed laser light PL2 is coupled to the single-mode optical fiber 80 at high coupling efficiency.

The mode converting units 43, 45 are not limited to the long-period grating, but may be formed with, for example, a binary phase plate disclosed in U.S. Pat. No. 7,672,552. The binary phase plate is, for example, a quartz glass plate having concentric grooves, and is capable of converting input light in the higher order mode into Gaussian-shaped light in the fundamental mode by correcting phase hops in beams of the pulsed laser light PL2 in the higher order mode, and of converting input light in the fundamental mode reversely into light in the higher order mode.

The binary phase plate may be attached directly to the optical fiber on a side from which the pulsed laser light PL2 is output, or can have an enlarging optical system, such as a lens, between itself and the optical fiber. Moreover, when the higher order mode is input, a 4f lens system to input the pulsed laser light PL2 that has passed through the binary phase plate, and an aperture to blocking pedestal components existing concentrically on an outer circumference side of a beam, may be provided to convert into a Gaussian-shaped fundamental mode.

First Modification

Figure 6:
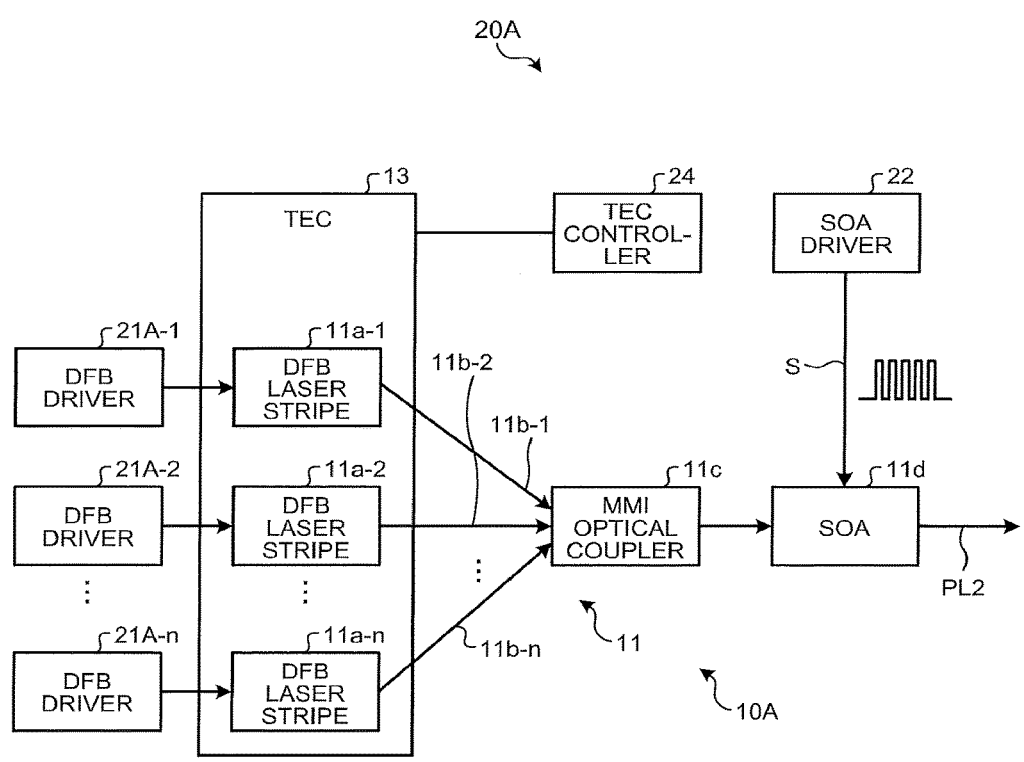
FIG. 6 is a diagram illustrating a first modification of the pulsed laser device according to the first embodiment.

FIG. 6 is a diagram illustrating a first modification of the pulsed laser device according to the first embodiment. The pulsed laser device according to this first modification is one in which the seed light source 10 and the control unit 20 in the pulsed laser device 100 according to the first embodiment are replaced with a seed light source 10A and a control unit 20A, respectively.

The seed light source 10A includes an electronic cooling device (TEC) 13, such as a Peltier device, on which the DFB laser stripes 11a-1 to 11a-n are mounted. Moreover, the control unit 20A includes a TEC control unit (TEC controller) 24 that supplies a driving current to the electronic cooling device 13. Furthermore, the control unit 20A includes plural DFB driving units (DFB drivers) 21A-1 to 21A-n formed to be able to supply a driving current to the respective DFB laser stripes 11a-1 to 11a-n.

In the pulsed laser device according to the first modification, by adjusting the temperature of the DFB laser stripes 11a-1 to 11a-n collectively by the electronic cooling device 13, the wavelength of laser light that is output from the DFB laser stripes 11a-1 to 11a-n can be adjusted collectively. Moreover, the DFB laser stripes 11a-1 to 11a-n can be supplied with an electric current individually from the corresponding DFB driving units 21A-1 to 21A-n.

Second Modification

Figure 7:
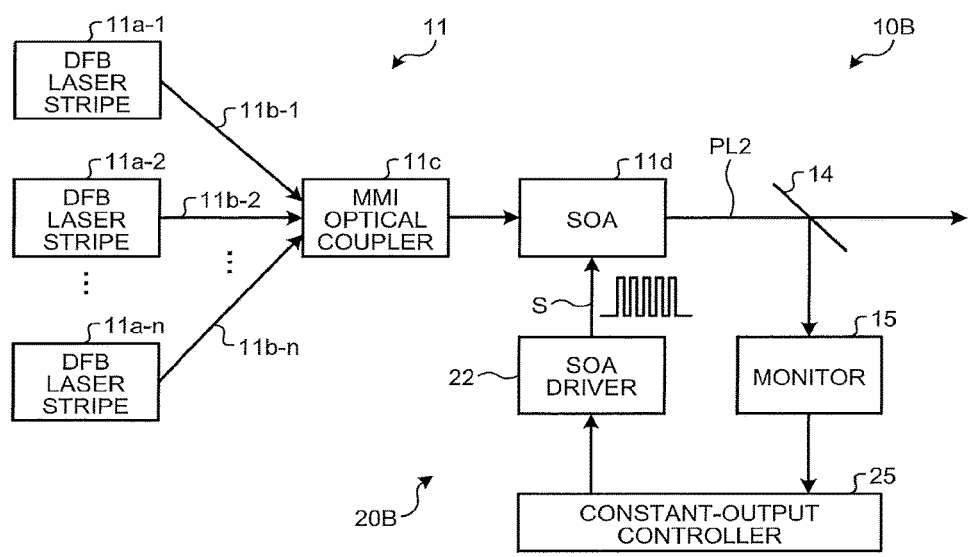
FIG. 7 is a diagram illustrating a second modification of the pulsed laser device according to the first embodiment.

FIG. 7 is a diagram illustrating a second modification of the pulsed laser device according to the first embodiment. The pulsed laser device according to the second modification is one in which the seed light source 10 and the control unit 20 in the pulsed laser device 100 according to the first embodiment are replaced with a seed light source 10B and a control unit 20B.

The seed light source 10B includes a reflection mirror 14 as a branching unit that branches a part of the pulsed laser light PL2 output from the integrated-semiconductor laser device 11 to output, and a Photo Detector (PD) as a monitoring unit 15 that monitors the power of the part of the laser light that has been branched off, in addition to the components of the seed light source 10.

In the pulsed laser device according to the second modification, the monitoring unit 15 outputs an electrical signal according to the power of monitored light to a constant-output control unit (constant-output controller) 25 as a monitoring result. The constant-output control unit 25 controls the SOA driving unit 22 such that the power of the pulsed laser light PL2 output from the integrated-semiconductor laser device 11 is constant based on the input electrical signal. Specifically, the constant-output control unit 25 outputs an indicated value to indicate a current value to be supplied to the semiconductor optical amplifier 11d to the SOA driving unit 22, such that the power of the pulsed laser light PL2 output from the integrated-semiconductor laser device 11 become constant. This constant output control is also termed as power feedback control, and can be implemented by providing a circuit that performs the publicly-known PI control or PID control in the constant-output control unit 25. Thus, the power of the pulsed laser light PL2 as seed light output from the seed light source 10B is stabilized.

Configuration Example 2 of Booster Amplifier

Figure 8:
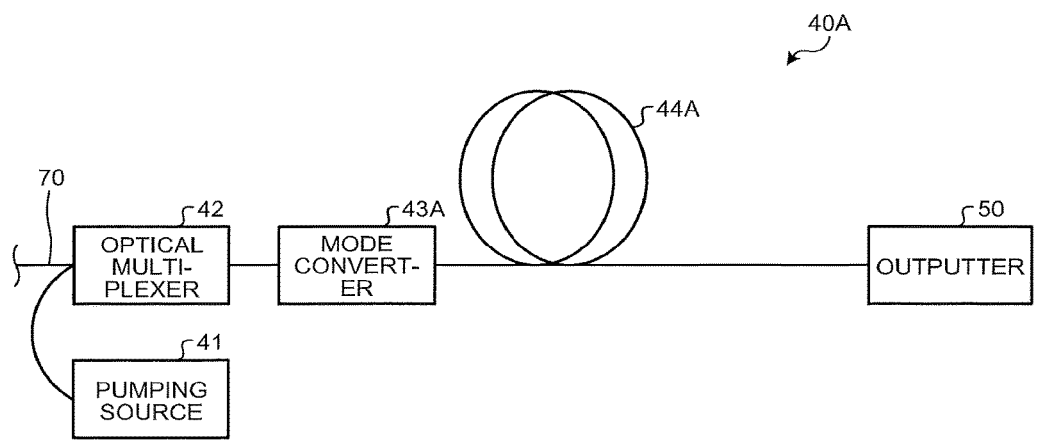
FIG. 8 is a schematic configuration diagram illustrating configuration example 2 of the booster amplifier.

FIG. 8 is a schematic configuration diagram illustrating configuration example 2 of the booster amplifier. A booster amplifier 40A illustrated in FIG. 8 has a configuration in which the mode converting unit 43 is replaced with a mode converting unit 43A, the optical amplification fiber 44 is replaced with an optical amplification fiber 44A, and the mode converting unit 45 is removed in the booster amplifier 40 illustrated in FIG. 5. Furthermore, in this configuration example 2, the output unit 50 is connected to the optical amplification fiber 44A.

The mode converting unit 43A serving as an effective-mode cross-section expanding unit expands an effective-mode cross-sectional area of the pulsed laser light PL2 and the pumping light by converting the propagation mode of the pulsed laser light PL2 received from the single-mode optical fiber 70 and the pumping light output from the pumping source 41 from the fundamental mode (LP01 mode) to a multi-mode including the higher order mode. The mode converting unit 43A may be formed with a fusion splice between the single-mode optical fiber on an output side of the optical multiplexer 42 and the optical amplification fiber 44A.

The optical amplification fiber 44A is, for example, an optical fiber disclosed in Thomas Sosnowski, et al. Proc. SPIE 8601, Fiber Lasers X: Technology, Systems, and applications, 86011M (Mar. 22, 2013); doi: 10.1117/12.2008306, and includes a central core having an expanded effective-mode cross-sectional area that is greater than, at least, that of a standard single-mode optical fiber used in optical fiber communications in the fundamental mode, and a satellite core that leaks components of the higher order mode. Moreover, the optical amplification fiber 44A is a rare-earth-doped optical fiber doped, in the central core, for example, with erbium having an optical amplification effect on light having the wavelength of the pulsed laser light PL2. The optical amplification fiber 44A leaks the components of the higher order mode out of the input pulsed laser light PL2 in the multi-mode from a side core, and amplifies components of the fundamental mode in the central core while propagating in the single mode by the optical amplification effect of a rare earth element optically pumped by the pumping light, and outputs it to the output unit 50. Thus, the pulsed laser light PL2 propagates in the optical amplification fiber 44A while being amplified in a state in which the effective-mode cross sectional area is expanded, and therefore, occurrence of the non-linear optical phenomenon in the optical amplification fiber 44A due to the pulsed laser light PL2 is suppressed.

Third Modification

Figure 9:
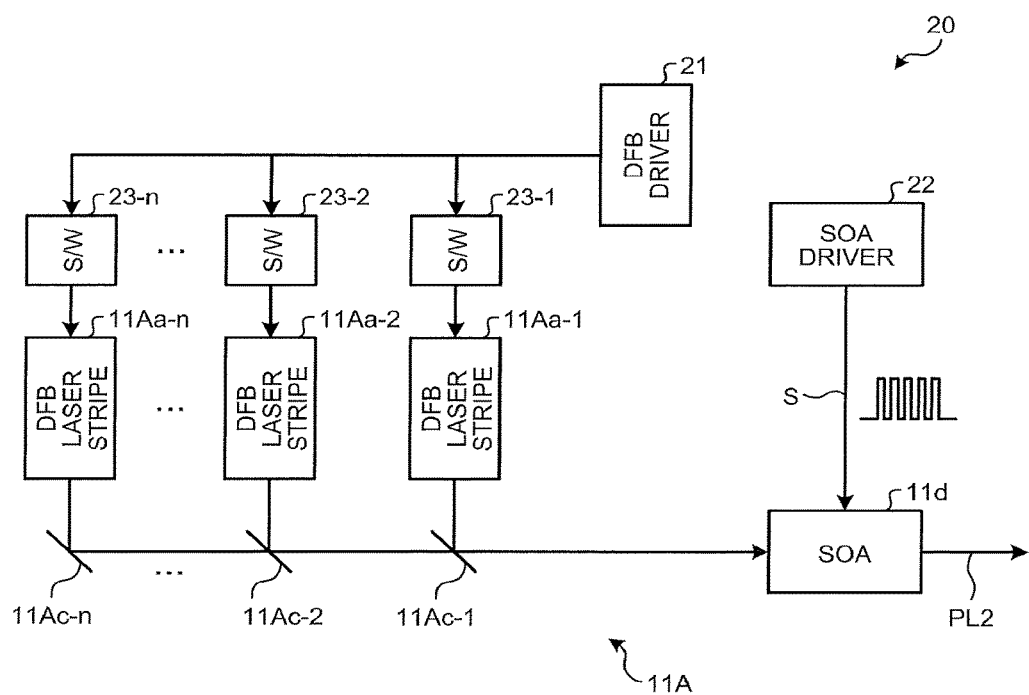
FIG. 9 is a diagram illustrating a third modification of the pulsed laser device according to the first embodiment.

FIG. 9 is a diagram illustrating a third modification of the pulsed laser device according to the first embodiment. A pulsed laser device according to the third modification is one in which the integrated-semiconductor laser device 11 in the pulsed laser device 100 according to the first embodiment is replaced with a semiconductor-laser device unit 11A.

The semiconductor-laser device unit 11A includes DFB laser devices 11Aa-1 to 11Aa-n (n is a positive integer equal to or greater than 2), and WDM filters 11Ac-1 to 11Ac-n. The DFB laser devices 11Aa-1 to 11Aa-n are formed to output laser light beams of 1 μm band (for example, 1.0 μm to 1.1 μm) having wavelengths different from each other. The DFB laser devices 11Aa-1 to 11Aa-n are preferable to be arranged in ascending or descending order of wavelength of laser light beams to be output. Moreover, the DFB laser devices 11Aa-1 to 11Aa-n are supplied with a driving current from the DFB driving unit 21 through the switch units 23-1 to 23-n.

The WDM filters 11Ac-1 to 11Ac-n are formed to multiplex laser light beams output from the DFB laser devices 11Aa-1 to 11Aa-n. For example, the WDM filter 11Ac-1 has a wavelength characteristic that laser light output from the DFB laser device 11Aa-1 is reflected, and laser light beams output from the WDM filters 11Ac-2 to 11Ac-n is passed. The WDM filter 11Ac-2 has a wavelength characteristic that laser light from the DFB laser device 11Aa-2 is reflected, and laser light beams output from the DFB laser devices 11Aa-3 to 11Aa-n is passed. Similarly, the WDM filter 11Ac-n has a wavelength characteristic that laser light output from the DFB laser device 11Aa-n is reflected. Thus, the WDM filters 11Ac-1 to 11Ac-n multiplex laser light beams output from the DFB laser devices 11Aa-1 to 11Aa-n, and input to the semiconductor optical amplifier 11d. The semiconductor optical amplifier 11d is formed to be capable of amplifying laser light of 1 μm band in the third modification. The laser light input to the semiconductor optical amplifier 11d is subject to pulse modulation and amplification by the semiconductor optical amplifier 11d, to be output as the puled laser light PL2 as seed light.

In the pulsed laser device according to the third modification, the preamplifier 30 and the booster amplifier 40 are also formed to be capable of amplifying laser light of 1 μm band. Therefore, a rare earth element doped in the respective amplifiers 30, 40 is, for example, ytterbium. Furthermore, the pumping source used in the preamplifier 30 and the booster amplifier 40 is one that outputs pumping light of a wavelength capable of optically pumping ytterbium, and includes a semiconductor laser that outputs pumping light of, for example, 915 nm wavelength.

Figure 10A:
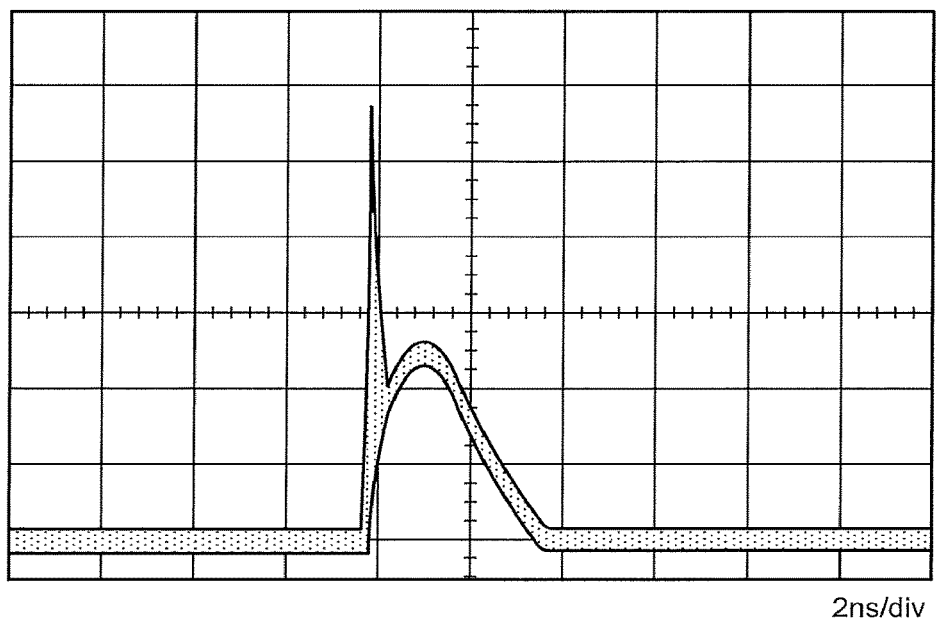
FIG. 10A is a diagram illustrating a comparative example.
Figure 10B:
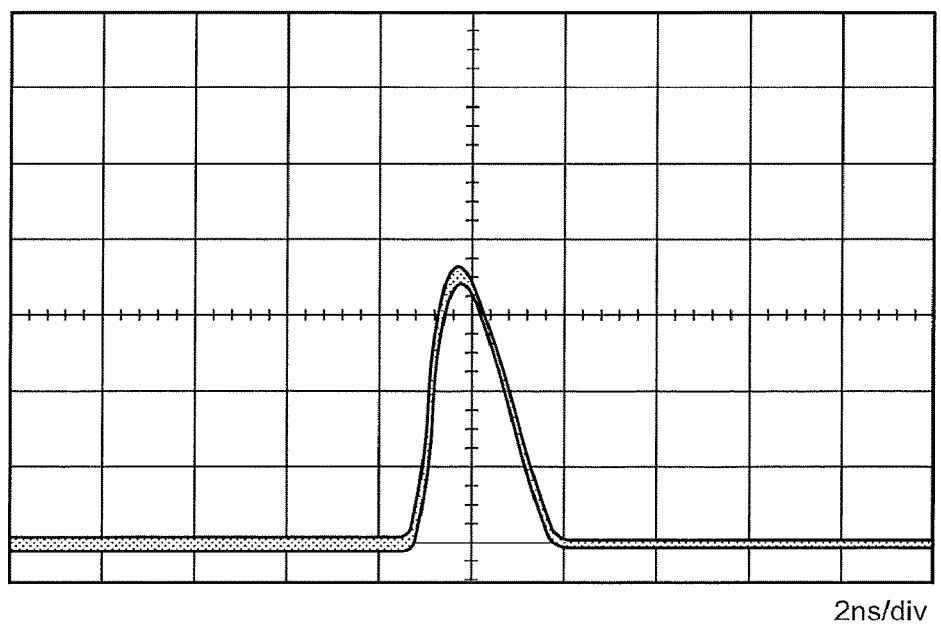
FIG. 10B is a diagram illustrating a practical example.

FIGS. 10A, 10B are diagrams illustrating a comparative example and a practical example of the present disclosure, respectively. FIG. 10A illustrates a pulse waveform of seed light when it is directly modulated by supplying pulse-modulated driving current to one of the DFB laser stripes by the DFB driving unit in the pulsed laser device having the configuration illustrated in FIG. 1 and FIG. 4 as a comparative example. FIG. 10B illustrates a pulse waveform of seed light when it is directly modulated by supplying a pulse-modulated driving current to the semiconductor optical amplifier by the SOA driving unit in the pulsed laser device having the configuration illustrated in FIG. 1 and FIG. 4 as a practical example. The horizontal axis is for time, and a vertical axis is for measured optical power of a pulse waveform expressed by voltage.

As illustrated in FIGS. 10A, 10B, in the comparative example, a pre-pulse occurs other than a pulse waveform by the pulse modulation, while in the practical example, a preferable pulse waveform without a pre-pulse is obtained.

Second Embodiment

Figure 11:
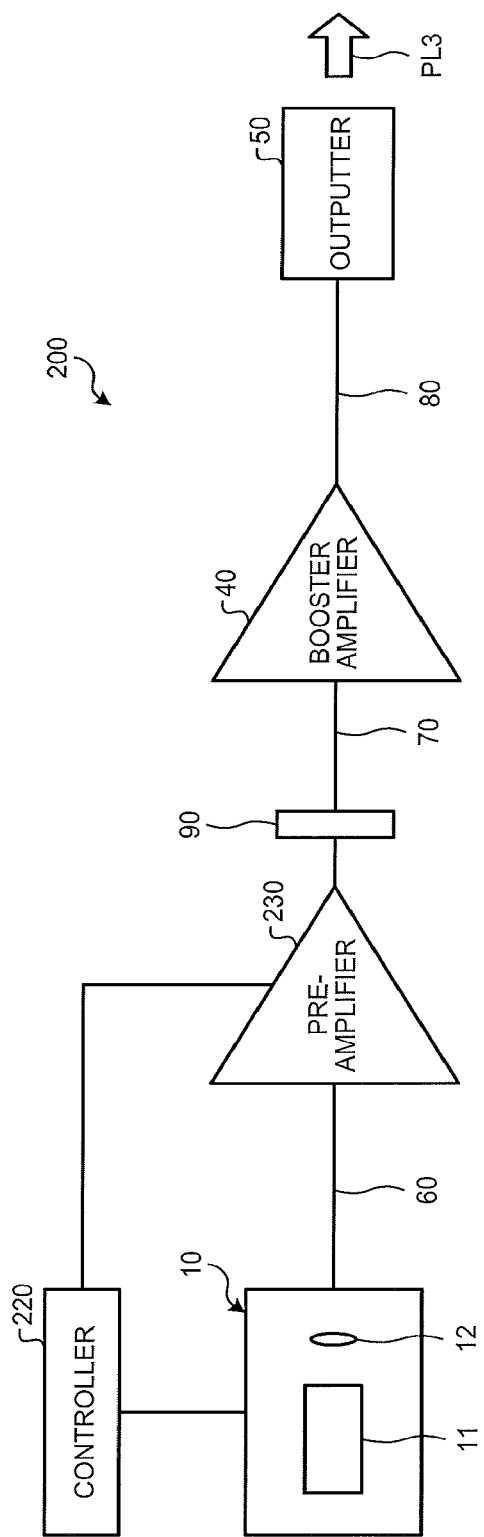
FIG. 11 is a schematic configuration diagram of a pulsed laser device according to a second embodiment.

FIG. 11 is a schematic configuration diagram of a pulsed laser device according to a second embodiment. As illustrated in FIG. 11, a pulsed laser device 200 includes the seed light source 10, a control unit (controller) 220, a preamplifier 230, the booster amplifier 40, the output unit 50, the single-mode optical fibers 60, 70, 80 that connect the seed light source 10, the preamplifier 230, the booster amplifier 40, and the output unit 50 with each other, and an optical bandpass filter 90 that is arranged in a subsequent stage of the preamplifier 230 and in a middle of the single-mode optical fiber 70. The pulsed laser device 200 outputs pulsed laser light PL3 from the output unit 50.

As the seed light source 10 is the same as that included in the pulsed laser device 100 according to the first embodiment, explanation thereof is omitted.

Figure 12:
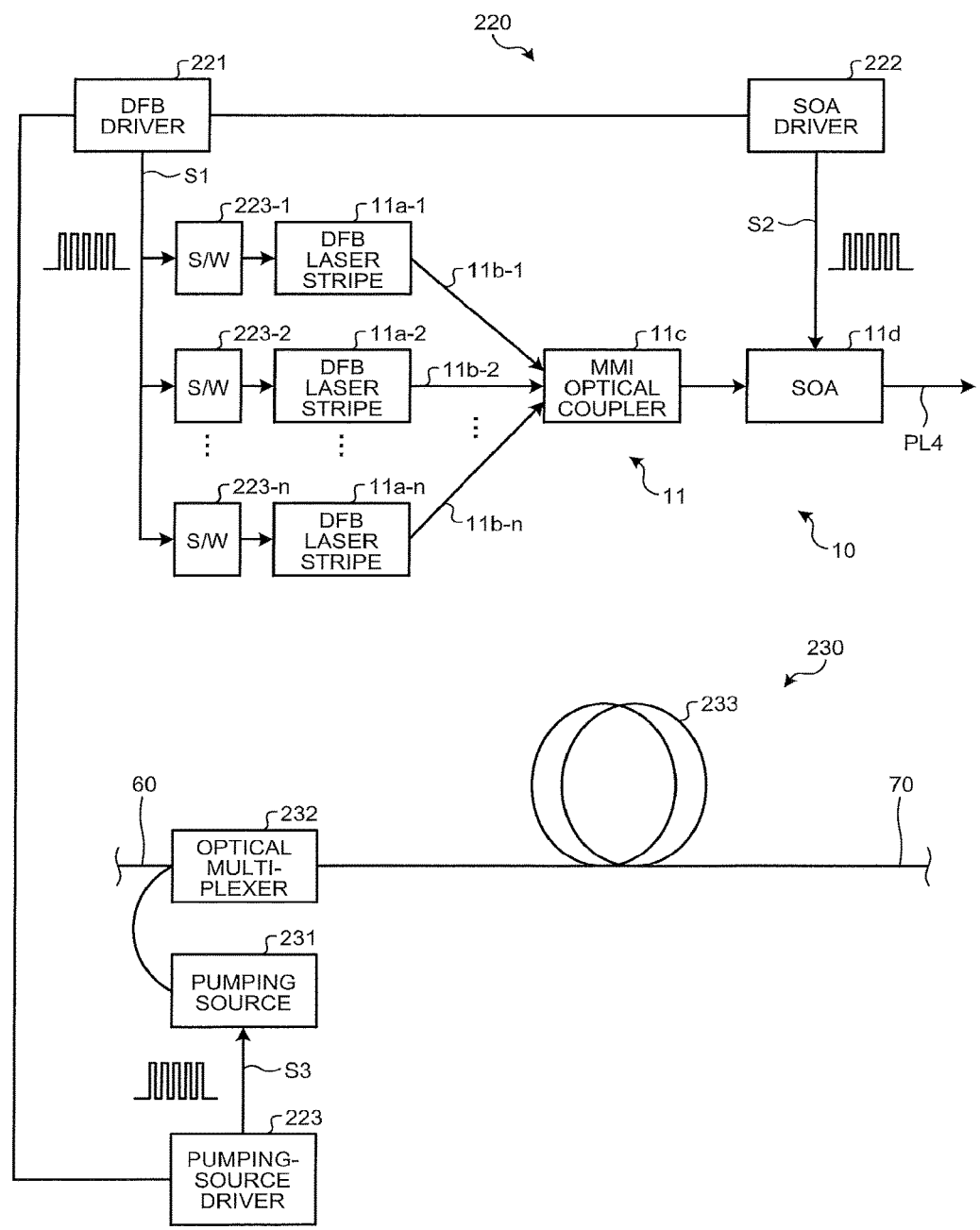
FIG. 12 is a schematic configuration diagram of a part related to an integrated-semiconductor laser device, a preamplifier, and a control unit.

FIG. 12 is a schematic configuration diagram of a part related to the integrated-semiconductor laser device 11, the control unit 220, and the preamplifier 230. In the following, a configuration of the preamplifier 230 is explained first, and a configuration of the control unit 220 is explained next.

The preamplifier 230 is an optical fiber amplifier that exerts an optical amplification effect by simulated emission on light having a wavelength of pulsed laser light PL4 as seed light that is output by the integrated-semiconductor laser device 11 described later. The preamplifier 230 includes a pumping source 231, an optical multiplexer 232, and an optical amplification fiber 233.

The pumping source 231 outputs pumping light to be supplied to the optical amplification fiber 233. The pumping source 231 includes a semiconductor laser device that outputs laser light having a 1.48 µm wavelength band or a 0.98 µm wavelength band that is a wavelength capable of pumping erbium as pumping light.

The optical multiplexer 232 multiplexes the pulsed laser light PL4 that has been output by the integrated-semiconductor laser device 11 and that has been propagated by the single-mode optical fiber 60 and the pumping light to output to the optical amplification fiber 233, and includes, for example, a WDM coupler or a TFB.

The optical amplification fiber 233 is a rare-earth-doped optical fiber to which an optical amplification effect is imparted by doping erbium having an optical amplification effect by simulated emission with respect to light having a wavelength of the pulsed laser light PL4.

The optical amplification fiber 233 amplifies the pulsed laser light PL4 while propagating therein by the optical amplification effect by simulated emission of a rare earth element (erbium) that is optically pumped by the pumping light, and outputs it to the single-mode optical fiber 70.

The control unit (controller) 220 includes a DFB driving unit 221 serving as a semiconductor-laser-device driving unit (semiconductor-laser-device driver) that is formed to be able to supply a DFB driving current S1 as a pulse-modulated semiconductor-laser-device driving current to the DFB laser stripes 11a-1 to 11a-n, an SOA driving unit (SOA driver) 222 serving as a semiconductor-optical-amplifier driving unit (semiconductor-optical-amplifier driver) that supplies an SOA driving current S2 as a pulse-modulated semiconductor-optical-amplifier driving current to the semiconductor optical amplifier 11d, and a pumping-source driving unit (pumping-source driver) 223 that supplies a pulse-modulated pumping-source driving current S3 to the pumping source 231 of the preamplifier 230. These driving units can be formed with a publicly-known laser driving circuit or the like. Moreover, the control unit 220 includes an arithmetic processing unit that performs various kinds of arithmetic processing to control these driving units, a storage unit such as a ROM in which various kinds of programs, data and the like to be used to perform the arithmetic processing by the arithmetic processing unit, and a storage unit such as RAM that is used as a work area when the arithmetic processing unit performs the arithmetic processing, or to store a result of the arithmetic processing by the arithmetic processing unit or the like.

Furthermore, the control unit 220 includes plural switch units 223-1 to 223-n to switch between supply and stop of a driving current to the DFB laser stripes 11a-1 to 11a-n from the DFB driving unit 221. The switch units 223-1 to 223-n are arranged in a middle of supply paths of the DFB driving current S1 to the DFB laser stripes 11a-1 to 11a-n from the DFB driving unit 221, respectively. The switch units 223-1 to 223-n may be formed with, for example, an analog switching circuit, or may be formed by providing a zero-ohm resister to a switch unit that is connected to the DFB laser stripe to which the driving current is to be supplied, and by releasing the supply path for a switch unit that is connected to the DFB laser strip to which the driving current is not to be supplied, or by providing a resister with high resistance value at a level enabled to exert the same effect as releasing.

When one or more out of the DFB laser stripes 11a-1 to 11a-n are supplied with the DFB driving current S1 through one or more out of the switch units 223-1 to 223-n by the DFB driving unit 221, the DFB laser stripe supplied with the DFB driving current S1 is directly modulated and driven to make laser oscillation, and outputs pulsed laser light that repeats a ON state and an OFF state. The wavelength of laser light output by the DFB laser stripes 11a-1 to 11a-n can be adjusted by adjusting an amount of the driving current supplied to the respective stripes. For example, when the driving current is increased, the temperature of the DFB laser stripe increases, and the wavelength of laser light shifts toward a long wavelength side.

Subsequently, the MMI optical coupler 11c couples (just pass when input laser light is one) plural laser light beams that are input through one or more out of the optical waveguides 11b-1 to 11b-n and outputs them to the semiconductor optical amplifier 11d. The semiconductor optical amplifier 11d receives the laser light beams.

The semiconductor optical amplifier 11d is directly modulated and driven by being supplied with the SOA driving current S2 from the SOA driving unit 222. Furthermore, the control unit 220 controls to secure coordination between the DFB driving unit 221 and the SOA driving unit 222, and synchronizes the pulse modulation of the DFB driving current S1 with the pulse modulation of the SOA driving current S2. Specifically, a cycle of an ON state and an OFF state of the DFB driving current S1 and a cycle of an ON state and an OFF state of the SOA driving current S2 are matched with each other. Moreover, the phase of the pulse modulation is adjusted such that when pulsed laser light output by the DFB laser stripe is input to the semiconductor optical amplifier 11d, the SOA driving current S2 in the ON state is supplied to the semiconductor optical amplifier 11d, to bring the semiconductor optical amplifier 11d into the state enabling optical amplification. Thus, the semiconductor optical amplifier 11d driven by the pulse-modulated SOA driving current S2 can amplify the pulsed laser light output by the DFB laser stripe to output as the pulsed laser light PL4. The pulse width and the duty ratio of the pulsed laser light PL4 can be adjusted by adjusting the pulse width and the duty ratio of the SOA driving current S2.

Referring back to FIG. 11, in the seed light source 10, the coupling lens system 12 couples the pulsed laser light PL4 output from the semiconductor optical amplifier lid of the integrated-semiconductor laser device 11 to the single-mode optical fiber 60. The single-mode optical fiber 60 propagates the pulsed laser light PL4 in the single mode, which is the fundamental mode, to input to the preamplifier 230.

The pumping source 231 of the preamplifier 230 is directly modulated and driven by being supplied with the pumping-source driving current S3 from the pumping-source driving unit 223. Furthermore, the control unit 220 controls to secure coordination with the pumping-source driving unit 223 also, in addition to the DFB driving unit 221 and the SOA driving unit 22 described above, and synchronizes the pulse modulation of the DFB driving current S1, the pulse modulation of the SOA driving current S2, with the pulse modulation of the pumping-source driving current S3. Specifically, a cycle of an ON state and an OFF state of the DFB driving current S1, a cycle of an ON state and an OFF state of the SOA driving current S2, and a cycle of an ON state and an OFF state of the pumping-source driving current S3 are matched with each other. Moreover, the phase of the pulse modulation is adjusted such that when pulsed laser light PL4 output by the semiconductor optical amplifier lid is input to the optical amplification fiber 233 of the preamplifier 230, the pumping-source driving current S3 in the ON state is supplied to the pumping source 231 to supply pumping light to the optical amplification fiber 233, and the optical amplification fiber 233 is thereby optically pumped to be in the optically excited state (state enabling optical amplification). Thus, the optical amplification fiber 233 optically pumped by the pumping source 231 that is driven by the pulse-modulated pumping-source driving current S3 can amplify the pulsed laser light PL4 to output it.

The single-mode optical fiber 70 propagates the pulsed laser light PL4 amplified by the preamplifier 230 in the single mode, which is the fundamental mode, to input to the booster amplifier 40. The optical bandpass filter 90, which is arranged in a middle of the single-mode optical fiber 70, is formed to have a passband so that light having a wavelength of the laser light output from the DFB laser stripe is selectively passed. Particularly, when laser light is output from two or more out of the DFB laser stripes 11a-1 to 11a-n, the passband is set so as to pass all of these laser light beams are passed. The optical bandpass filter 90 may be arranged in a subsequent stage of the preamplifier 30 of the pulsed laser device 100 and in a middle of the single-mode optical fiber 70.

The booster amplifier 40 is preferably an optical fiber amplifier that has a higher maximum output than the preamplifier 230, and receives the amplified pulsed laser light PL4 and further amplifies it to output to the single-mode optical fiber 80. The single-mode optical fiber 80 propagates the further amplified pulsed laser light PL4 in the single mode, which is the fundamental mode. The output unit 50 outputs the further amplified pulsed laser light PL4 that has been propagated by the single-mode optical fiber 80 as the pulsed laser light PL3.

Next, a time waveform of the pulsed laser light PL4 that is output from the semiconductor optical amplifier 11d and a time waveform of the amplified pulsed laser light PL4 that is output from the preamplifier 230 in the pulsed laser device 200 are explained.

Figure 13:
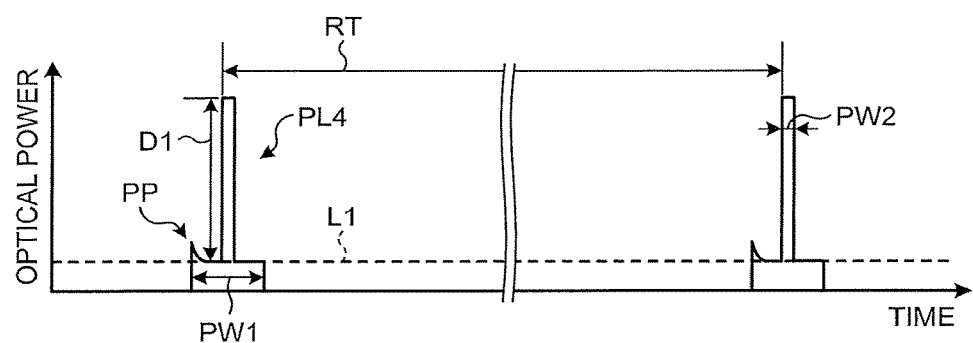
FIG. 13 is a diagram illustrating a time waveform of light that is output from a semiconductor optical amplifier.

FIG. 13 is a diagram illustrating a time waveform of the pulsed laser light PL4 that is output from the semiconductor optical amplifier 11d. A sign RT denotes a repetition time of the pulse modulation of the DFB driving current S1 and the SOA driving current S2. The repetition time RT is 1 s to 1 μs order, and is of the order of 0.1 μs or more. That is, as a repetition frequency, it is 1 Hz to 1 MHz order, and is of the order of 10 MHz or lower. A sign PW1 denotes a pulse width of the DFB driving current S1, and the pulse width PW1 is, for example, 10 ns to 100 ns. A sign PW2 denotes a pulse width of the SOA driving current S2, and the pulse width PW2 is, for example, 0.1 ns to 2 ns. Therefore, a modulated pulse width of the DFB driving current S1 is set to be greater than a modulated pulse width of the SOA driving current S2. As the pulse width of the pulsed laser light PL4 is substantially the same as the pulse width of the SOA driving current S2, in the following, the pulse width of the pulsed laser light PL4 is expressed as the pulse width PW2. Moreover, a sign PP denotes a pre-pulse in a surge state by relaxation oscillation of the DFB laser stripe.

When directly modulated and driven by the DFB driving current S1, the DFB laser stripe is driven for a period of the pulse width PW1 and makes laser oscillation. As the pulse width of pulsed laser light output by the DFB laser stripe is substantially the same as the pulse width of the DFB driving current S1, in the following, the pulse width of pulsed laser light output by the DFB laser stripe is expressed as the pulse width PW1. Moreover, when directly modulated and driven by the SOA driving current S2, the semiconductor optical amplifier 11d is driven for a period of the pulse width PW2, and exerts the optical amplification effect. When the semiconductor optical amplifier 11d is not driven (in the OFF state), pulsed laser light output from the DFB laser stripe is mostly absorbed by the semiconductor optical amplifier 11d. As a result, light that has not been absorbed is output from the semiconductor optical amplifier 11d, and has the optical power of a level indicated by a line L1. On the other hand, when the semiconductor optical amplifier 11d is driven (in the ON state), the pulsed laser light output from the DFB laser stripe is amplified by the semiconductor optical amplifier 11d. As a result, the pulse laser light PL4 having the optical power of a level higher by a power D1 than the level indicated by the line L1 is output from the semiconductor optical amplifier 11d.

As described above, the control unit 220 synchronizes the pulse modulation of the DFB driving current S1 with the pulse modulation of the SOA driving current S2. Thus, the pulsed laser device 200 can output the pulsed laser light PL4 at a high level amplified in the predetermined repetition time RT.

Moreover, in the pulsed laser device 200, a higher extinction ratio can be obtained that in the case that the DFB laser stripe is driven by a direct current to make CW laser oscillation. Specifically, when the DFB laser stripe is caused to make the CW laser oscillation, laser light having the optical power of the level indicated by the line L1 is always output from the semiconductor optical amplifier 11d. A time integral value of this CW laser light decreases the SNR of the amplified pulsed laser light PL4 output from the semiconductor optical amplifier 11d, as a ratio (duty ratio) between the repetition time RT and the pulse width PW2 increases. On the other hand, in the pulsed laser device 200, the DFB laser stripe is pulse-modulation driven. Therefore, the temporal accumulation of laser light is suppressed, and a high SNR can be obtained.

For example, suppose the pulsed width PW2 is 2 ns, and the repetition time RT is 20 μs, and the duty ratio of these is 10000. In this case, even when a power ratio between the optical power of pulsed laser light obtained by the pulse modulation of the semiconductor optical amplifier 11d and the optical power of the CW laser light is 60 dB, the energy ratio is 20 dB after an integration in time, due to the temporal accumulation of the CW laser light. This is unfavorable as this corresponds to that laser light having the optical power equivalent to 1% of the optical power of the pulsed laser light is output even during a period in which output of the pulsed laser light is in the OFF state, and the SNR is low. For example, when the pulsed laser device is used for laser processing, components other than the pulsed laser light are unfavorably irradiated to a work to be processed even in a period in which the pulsed laser light for using the processing is turned into the OFF state.

On the other hand, in the pulsed laser device 200, when the pulsed width PW1 is 20 ns, the energy ratio between the pulsed laser light PL4 amplified by the semiconductor optical amplifier lid and the pulsed laser light of the pulse width PW1 indicated by the line L1 is 50 dB even after an integration in time, and the SNR is high. Moreover, as the level indicated by the line L1 when output of the pulsed laser light is in the OFF state decreases, the extinction ratio is to be 60 dB or higher.

Furthermore, as the DFB laser stripe and the semiconductor optical amplifier 11d can increase the modulation speed until obtaining the pulse width of the order of sub-nano second, the pulsed laser device 200 can output short pulsed light with a high extinction ratio. Particularly, the semiconductor optical amplifier lid does not generate relaxation oscillation even if driven by a pulse-modulated driving current, the pulsed laser light PL4 has a favorable pulse waveform even when the pulse width PW2 is a sub-nano second to nano second order.

Moreover, when the pulse modulation of the DFB driving current S1, the pulse modulation of the SOA driving current S2, and the pulse modulation of the pumping-source driving current S3 are synchronized with each other, it is preferable to synchronize them such that a pre-pulse PP and the amplified pulsed laser light PL4 are not overlapped in time. Thus, the amplified pulsed laser light PL4 has a favorable waveform without a surge caused by the pre-pulse PP.

Figure 14:
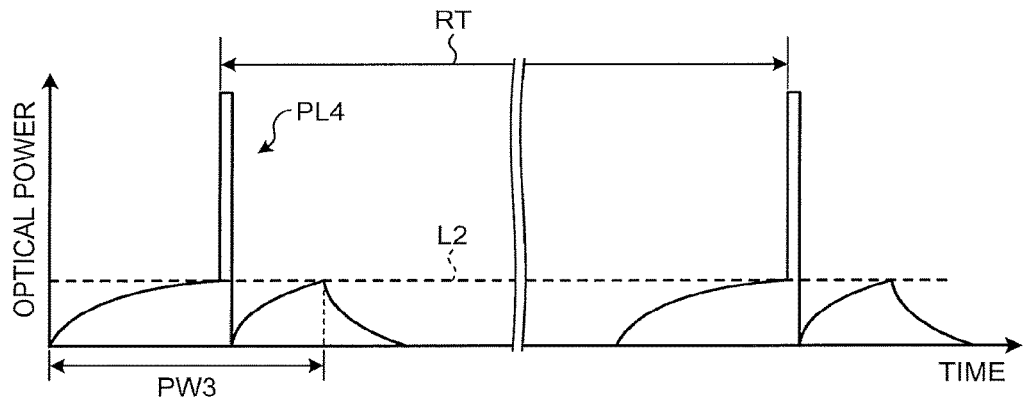
FIG. 14 is a diagram illustrating a time waveform of light that is output from the preamplifier.

Next, FIG. 14 is a diagram illustrating a time waveform of light that is output from the preamplifier 230. In FIG. 14, a portion corresponding to the pulse width PW2 is omitted. A sign PW3 denotes a pulse width of the pumping-source driving current S3, and the pulse width PW3 is, for example, several μs. Therefore, the modulation pulse width of the pumping-source driving current S3 is set to be greater than the modulation pulse width of the SOA driving current S2 and the modulation pulse width of the DFB driving current S1.

When directly modulation-driven by the pumping-source driving current S3, the pumping source 231 is driven for a period of the pulse width PW3 and supplies pulsed pumping light to the optical amplification fiber 233, and causes the optical amplification fiber 233 to exert the optical amplification effect. As the pulse width of the pumping light is substantially the same as the pulse width of the pumping-source driving current S3, in the following, the pulse width of the pumping light is also indicated as the pulse width PW3. During a period in which the optical amplification effect is exerted, the optical amplification fiber 233 outputs Amplified Spontaneous Emission (ASE) light having a power according to the size of a population inversion of erbium in the optical amplification fiber 233 described later. As a result, the light output from the preamplifier 230 is light in which the ASE light reaching a level indicated by a line L2 and the pulsed laser light PL4 that is amplified by the preamplifier 230 are superimposed on each other.

As described above, the control unit 220 synchronizes the pulse modulation of the DFB driving current S1, the pulse modulation of the SOA driving current S2, with the pulse modulation of the pumping-source driving current S3. Thus, the pulsed laser device 200 can output the pulsed laser light PL4 at a high level further amplified in the predetermined repetition time RT.

Furthermore, in the pulsed laser device 200, a higher extinction ratio can be obtained than in the case that the pumping source 231 is driven by a direct current to make CW laser light, and the preamplifier 230 is in the optically excited state all the time. Specifically, when the preamplifier 230 is always in the optically excited state, the ASE light is output from the preamplifier 230 all the time. A time integral value of this ASE light deteriorates the SNR of the amplified pulsed laser light PL4 output from the preamplifier 230 as a ratio (duty ratio) between the repetition time RT and the pulse width PW2 increases. On the other hand, in the pulsed laser device 200, the pumping source 231 is pulse-modulation driven. Therefore, the temporal accumulation of ASE light is suppressed, and a high SNR can be obtained.

Figure 15:
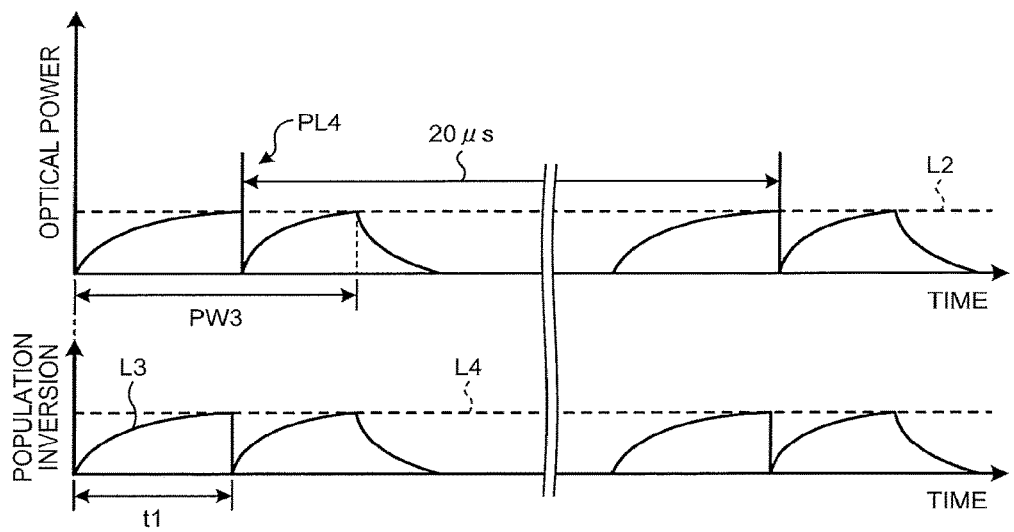
FIG. 15 is a diagram illustrating a relationship between a time waveform of light output from the preamplifier and a time waveform of population inversion.

Next, a relationship between the power of the ASE light output from the preamplifier 230 and a population inversion of erbium in the optical amplification fiber 233 is explained. FIG. 15 is a diagram illustrating a relationship between a time waveform of the optical power of light output from the preamplifier 230 and a time waveform (indicated by a line L3) of population inversion in a laser level of erbium in the optical amplification fiber 233. The population inversion signifies a population inversion coefficient. Although the pulse laser light PL4 is expressed linearly in FIG. 15, it has the pulse width PW1 as illustrated in FIG. 13 in an actual situation. Moreover, the repetition time is 20 μs.

As illustrated in FIG. 15, the population inversion gradually increases when the pumping light is input to the optical amplification fiber 233, and becomes substantially saturated when time t1 has passed since input of the pumping light, to reach a level expressed by a line L4. The time t1 is relaxation time. The relaxation time t1 is, for example, μs order. In the example illustrated in FIG. 15, as the pulsed laser light PL4 is input after the population inversion has become substantially saturated in the optical amplification fiber 233, the pulsed laser light PL4 is sufficiently optically-amplified by simulated emission. Right after the pulsed laser light PL4 is amplified, erbium in the excited state immediately returns to the fundamental state, and therefore, the population inversion immediately becomes zero. The population inversion gradually increases again with pumping light subsequently input, and when input of the pumping light stops (turned into the OFF state), the population inversion gradually decreases to zero.

Figure 16:
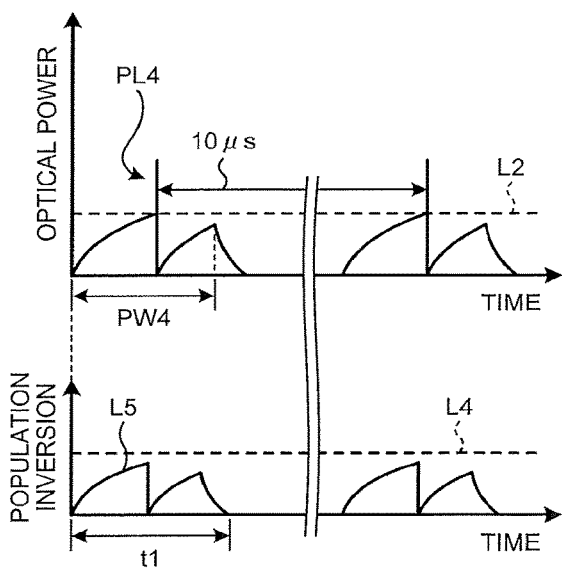
FIG. 16 is a diagram illustrating a relationship between the time waveform of light output from the preamplifier and a time waveform of population inversion.

Next, FIG. 16 is a diagram illustrating a time waveform of an optical power of light output from the preamplifier 230 and a time waveform (indicated by a line L5) of population inversion in a laser level of erbium in the optical amplification fiber 233. Note that the repetition time differs from 20 μs in the case of FIG. 15, but is shortened to 10 μs for high-speed modulation.

When the repetition time is shortened to 10 μs, to maintain the SNR to be similar to the case of 20 μs, it is preferable that the modulation pulse width of the pumping-source driving current S3 set to a pulse width PW4 that is the pulse width of about ½ of the pulse width PW3. However, in this case, as illustrated in FIG. 16, as time period since the pumping light is input to the optical amplification fiber 233 until the pulse laser light PL4 is input is shorter than the relaxation time t1, the pulsed laser light PL4 is input before the population inversion reaches the level indicated by the line L4. In this case, because the population inversion is smaller than the case illustrated in FIG. 15, the level of optical amplification of the pulsed laser light PL4 also becomes smaller than that in the case illustrated in FIG. 15, and the optical power thereof also decreases.

Figure 17:
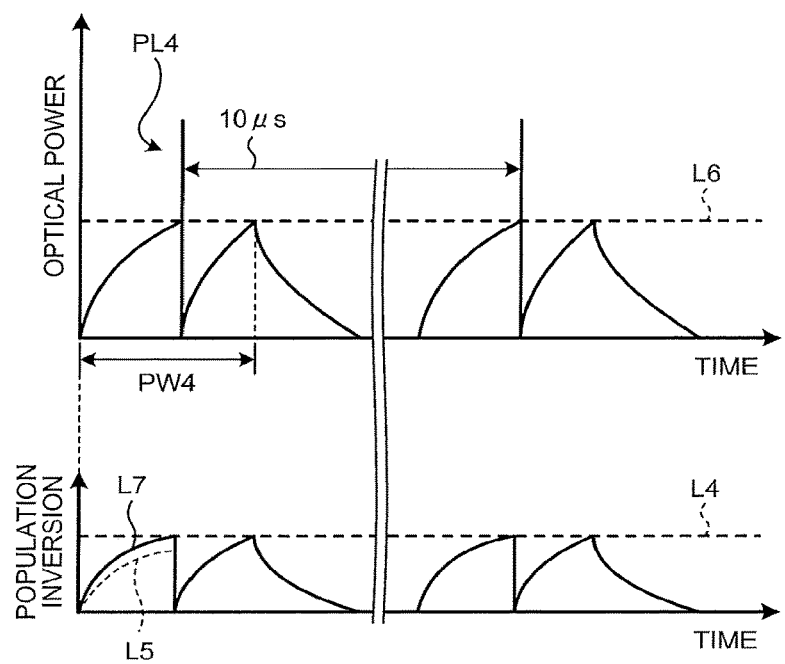
FIG. 17 is a diagram illustrating a relationship between the time waveform of light output from the preamplifier and a time waveform of population inversion.

In this case, it is preferable that the pumping-source driving current S3 be increased. FIG. 17 illustrates a time waveform of optical power of light output from the preamplifier 230, and as the pumping-source driving current S3 is increased, the level of the ASE light is at a level indicated by a line L6 that is higher than the level indicated by the line L2 illustrated in FIG. 15, FIG. 16. By thus increasing the pumping-source driving current S3, a temporal increase rate of population inversion indicated by a line L7 in FIG. 17 becomes higher than a temporal increase rate of the population inversion indicated by the line L5 in FIG. 16. For comparison, the line L5 is also illustrated in FIG. 17 with a broken line. Therefore, the population inversion reaches the level indicated by the line L4 before the pulsed laser light PL4 is input to the optical amplification fiber 233, and the level of optical amplification and the optical power thereof are maintained to the same level as those in the case illustrated in FIG. 15. As described, by control of the control unit 220, it is preferable that the pumping-source driving current S3 be increased as the modulation pulse width of the pumping-source driving current S3 decreases, to obtain the sufficient level of optical amplification and the optical power thereof in the preamplifier 230.

Furthermore, when the modulation pulse width of the pumping-source driving current S3 is shortened, the control unit 220 can control to synchronize the pulse modulation of the SOA driving current S2 with the pulse modulation of the pumping-source driving current S3 so that the pulse laser light PL4 is input to the preamplifier 230 in a latter half of a period of the optically excited state period in the preamplifier 230 instead of increasing the pumping-source driving current S3 as illustrated in FIG. 17.

Figure 18:
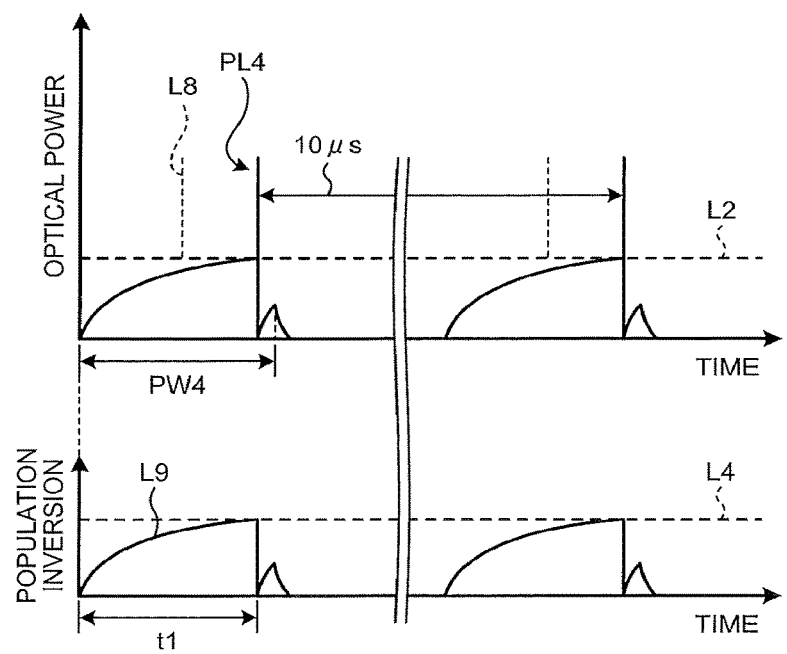
FIG. 18 is a diagram illustrating a relationship between the time waveform of light output from the preamplifier and a time waveform of population inversion.

In the following, explanation is given by referring to FIG. 18. As illustrated in FIG. 18, in this control, the level of the ASE light is at the level of the line L2 similarly to the case illustrated in FIG. 16, and the pumping-source driving current S3 is not increased. However, in this control, the pulsed laser light PL4 is input to the preamplifier 230 in a latter half of a period of the optically excited state (period of the pulse width PW4) in the preamplifier 230. For comparison, timing of input of the pulse laser light PL4 in the case illustrated in FIG. 16 is indicated by a line L8 in FIG. 18. When the pulsed laser light PL4 is to be thus input to the preamplifier 230 in the latter half of the period of the optically excited state period in the preamplifier 230, as indicated by a line L9 in FIG. 18, the pulsed laser light PL4 is input after the relaxation time t1 has passed when the population inversion reaches the level of the line L4 since the pumping-source driving current S3 is input to the optical amplification fiber 233. Therefore, the level of optical amplification of the pulsed laser light PL4 and the optical power thereof are maintained to the same level as that in the case illustrated in FIG. 15 along with the extinction ratio.

To obtain the state illustrated in FIG. 15, FIG. 18, it is preferable that the pulse width PW3 of the pumping-source driving current S3 be set longer than the relaxation time t1 of erbium in the preamplifier 230.

Although in the above control example, the pulsed laser light PL4 is input when the relaxation time t1 has passed that is when the population inversion reaches the level of the line L4, after the pumping-source driving current S3 is input to the optical amplification fiber 233, timing of inputting the pulsed laser light PL4 is not necessarily required to be after the relaxation time t1 passes. For example, the pulsed laser light PL4 may be input when the population inversion with which desired optical amplification is obtained or later thereafter.

Furthermore, the pumping light input to the optical amplification fiber 233 after optically amplifying the pulsed laser light PL4 is not used for optical amplification, and causes deterioration of the SNR. Therefore, by synchronizing the pulse modulation of the SOA driving current S2 and the pulse modulation of the pumping-source driving current S3 while adjusting the pulse width of the pumping-source driving current S3 such that the optically excited state is turned into the OFF state in the preamplifier 230 at substantially the same time as when the pulsed laser light PL4 becomes the OFF state by control of the control unit 220, the SNR can be further increased.

Moreover, when the relaxation time of the preamplifier 230 is longer than the period of the OFF state of pulses of the pumping-source driving current S3, there is a case in which the optical amplification fiber 233 does not have a satisfactory state of the population inversion when the pulsed laser light PL4 is input to the optical amplification fiber 233. In this case, by control of the control unit 220, the pumping-source driving unit 223 may be switched to supply a predetermined value of a direct current of a pumping-source driving current to the pumping source 231. Thus, the pumping source 231 outputs pumping light all the time. Therefore, when the pulsed laser light PL4 is input to the optical amplification fiber 233, the optical amplification fiber 233 has a satisfactory state of the population inversion and, therefore, sufficient optical amplification and the optical power thereof can be obtained.

As explained above, the pulsed laser device 200 can output the pulsed laser light PL4 having a pulse width of sub-nanoseconds to several nanoseconds at a high extinction ratio, and can output the pulsed laser light PL3 having a favorable pulse waveform.

First Modification of Second Embodiment

Figure 19:
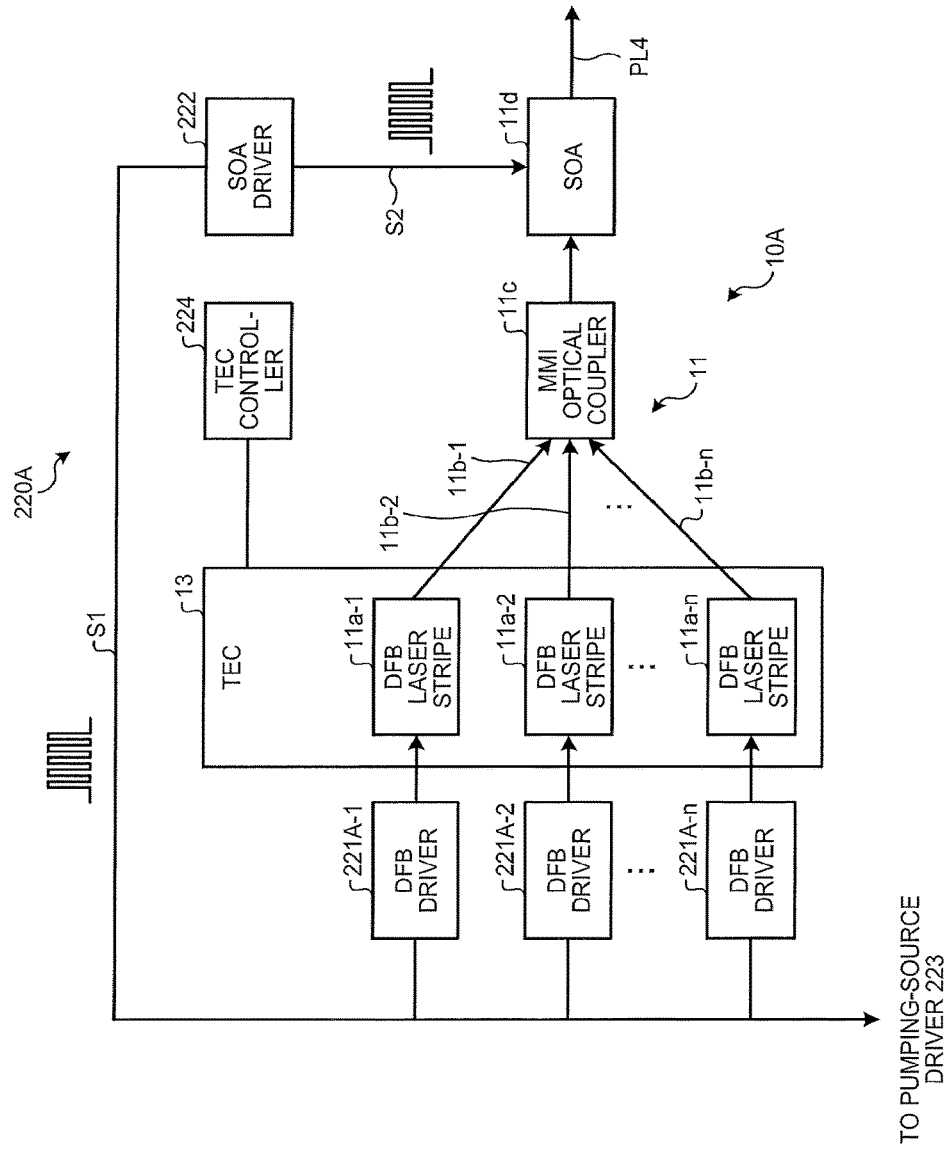
FIG. 19 is a diagram illustrating a first modification of the pulsed laser device according to the second embodiment.

FIG. 19 is a diagram illustrating a first modification of the pulsed laser device according to the second embodiment. The pulsed laser device according to the first modification is one in which the seed light source 10 and the control unit 220 in the pulsed laser device 200 according to the second embodiment are replaced with a seed light source 10A and a control unit 220A, respectively.

The seed light source 10A includes the electronic cooling device (TEC) 13, such as a Peltier device, on which the DFB laser stripes 11a-1 to 11a-n are mounted. Moreover, the control unit 220A includes a TEC control unit 224 that supplies a driving current to the electronic cooling device 13. Furthermore, the control unit 220A includes plural DFB driving units 221A-1 to 221A-n formed to be able to supply a driving current to the respective DFB laser stripes 11a-1 to 11a-n, in place of the DFB driving unit 221.

In the pulsed laser device according to the first modification, by adjusting the temperature of the DFB laser stripes 11a-1 to 11a-n collectively by the electronic cooling device 13, the wavelength of laser light that is output from the DFB laser stripes 11a-1 to 11a-n can be adjusted collectively. Moreover, the DFB laser stripes 11a-1 to 11a-n can be supplied with an electric current individually from the corresponding DFB driving units 221A-1 to 221A-n.

Second Modification of Second Embodiment

Figure 20:
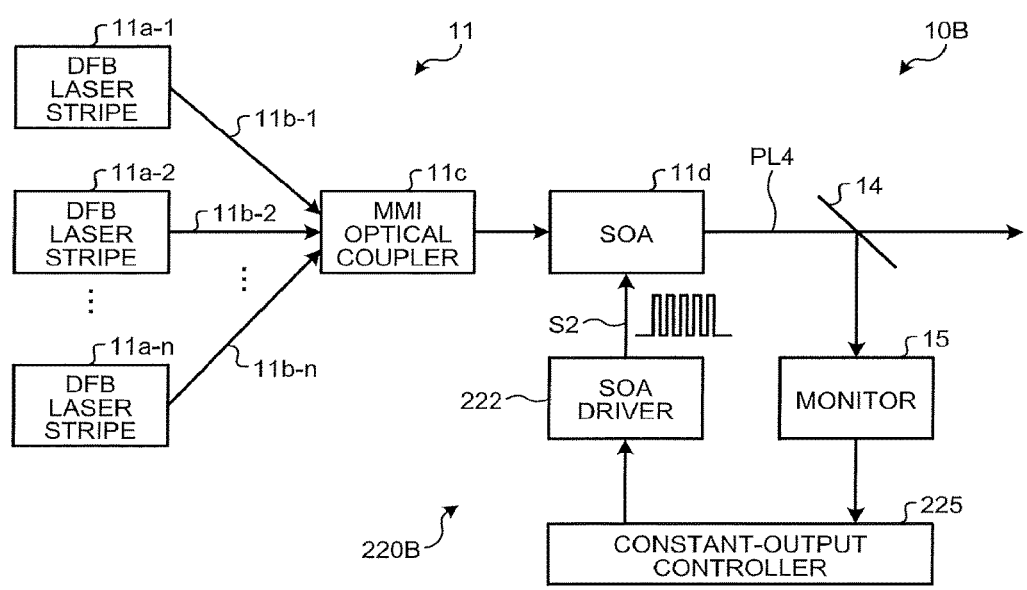
FIG. 20 is a diagram illustrating a second modification of the pulsed laser device according to the second embodiment.

FIG. 20 is a diagram illustrating a second modification of the pulsed laser device according to the second embodiment. The pulsed laser device according to the second modification is one in which the seed light source 10 and the control unit 220 in the pulsed laser device 200 according to the second embodiment are replaced with the seed light source 10B and a control unit 220B, respectively.

The seed light source 10B includes the reflection mirror 14 as a branching unit that branches a part of the pulsed laser light PL4 output from the integrated-semiconductor laser device 11 to output, and a Photo Detector (PD) as the monitoring unit (monitor) 15 that monitors the power of the part of the laser light that has been branched off, in addition to the components of the seed light source 10. Moreover, the control unit 220B includes a constant-output control unit (constant-output controller) 225 in addition to the components of the control unit 220.

In the pulsed laser device according to the second modification, the monitoring unit 15 outputs an electrical signal according to the power of monitored light to the constant-output control unit 225 as a monitoring result. The constant-output control unit 225 controls the SOA driving unit 222 such that the power of the pulsed laser light PL4 output from the integrated-semiconductor laser device 11 is constant based on the input electrical signal. Specifically, the constant-output control unit 225 outputs an indicated value to indicate a current value to be supplied to the semiconductor optical amplifier 11d, to the SOA driving unit 222 such that a power of the pulsed laser light PL4 output from the integrated-semiconductor laser device 11 becomes constant. This constant output control is also termed as power feedback control, and can be implemented by providing a circuit that performs the publicly-known PI control or PID control in the constant-output control unit 225. Thus, the power of the pulsed laser light PL4 as seed light output from the seed light source 10B is stabilized.

Third Modification of Second Embodiment

Figure 21:
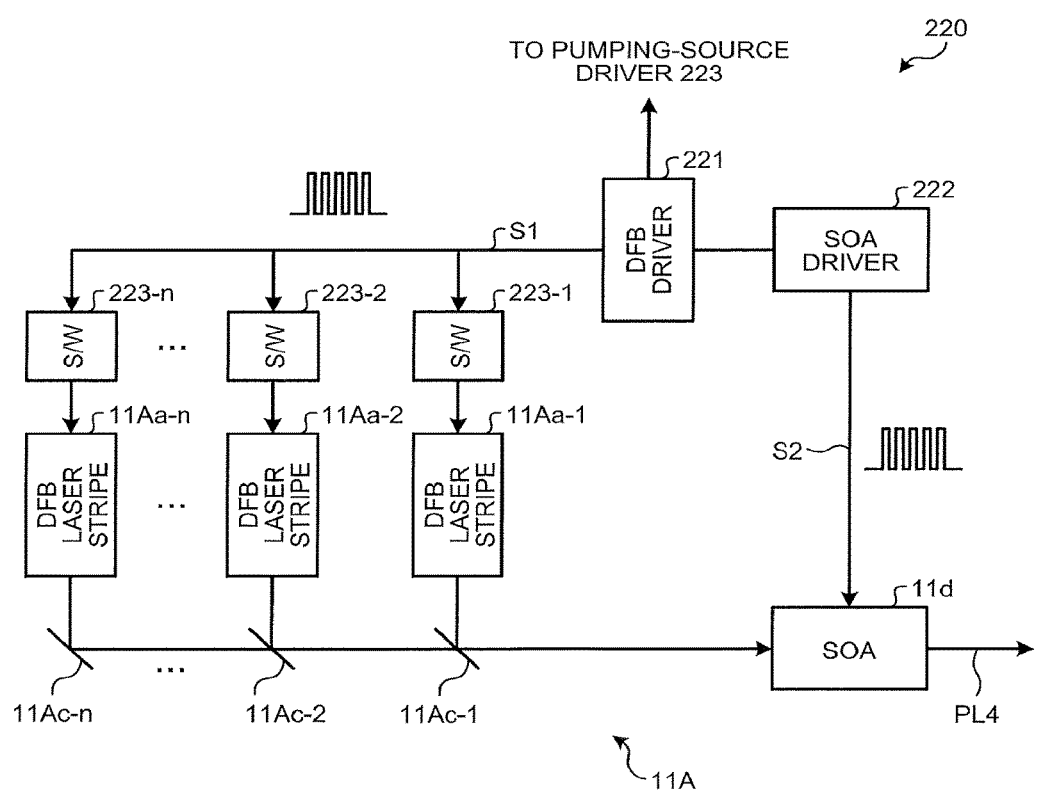
FIG. 21 is a diagram illustrating a third modification of the pulsed laser device according to the second embodiment.

FIG. 21 is a diagram illustrating a third modification of the pulsed laser device according to the second embodiment. In the pulsed laser device according to the third modification, the integrated-semiconductor laser device 11 in the pulsed laser device 200 according to the second embodiment is replaced with the semiconductor-laser device unit 11A.

The semiconductor-laser device unit 11A includes the DFB laser devices 11Aa-1 to 11Aa-n (n is a positive integer equal to or greater than 2), and the WDM filters 11Ac-1 to 11Ac-n. The DFB laser devices 11Aa-1 to 11Aa-n are formed to output laser light of 1 µm band (for example, 1.0 µm to 1.1 µm) having wavelengths different from each other. The DFB laser devices 11Aa-1 to 11Aa-n are preferable to be arranged in ascending or descending order of wavelength of laser light to be output. Moreover, the DFB laser devices 11Aa-1 to 11Aa-n are supplied with the DFB driving current S1 from the DFB driving unit 221 through the switch units 223-1 to 223-n.

The WDM filters 11Ac-1 to 11Ac-n are formed to multiplex laser light beams output from the DFB laser devices 11Aa-1 to 11Aa-n. For example, the WDM filter 11Ac-1 has a wavelength characteristic that laser light output from the DFB laser device 11Aa-1 is reflected, and laser light beams output from the DFB laser devices 11Aa-2 to 11Aa-n is passed. The WDM filter 11Ac-2 has a wavelength characteristic that laser light from the DFB laser device 11Aa-2 is reflected, and laser light beams output from the DFB laser devices 11Aa-3 to 11Aa-n is passed. Similarly, the WDM filter 11Ac-n has a wavelength characteristic that laser light output from the DFB laser device 11Aa-n is reflected. Thus, the WDM filters 11Ac-1 to 11Ac-n multiplex laser light beams output from the DFB laser devices 11Aa-1 to 11Aa-n, and input to the semiconductor optical amplifier 11d. In the third modification, the semiconductor optical amplifier 11d is formed to be capable of amplifying laser light of 1 µm band. The laser light input to the semiconductor optical amplifier 11d is subject to pulse modulation and amplification by the semiconductor optical amplifier 11d, to be output as the pulsed laser light PL4 as seed light.

In the pulsed laser device according to the third modification, the preamplifier 230 and the booster amplifier 40 are also formed to be capable of amplifying laser light of 1 µm band. Therefore, a rare earth element doped in the respective amplifiers 30, 40 is, for example, ytterbium. Furthermore, the pumping source used in the preamplifier 230 and the booster amplifier 40 is one that outputs pumping light of a wavelength capable of optically pumping ytterbium, and includes a semiconductor laser that outputs pumping light of, for example, 915 nm wavelength.

Figures 22A, 22B:
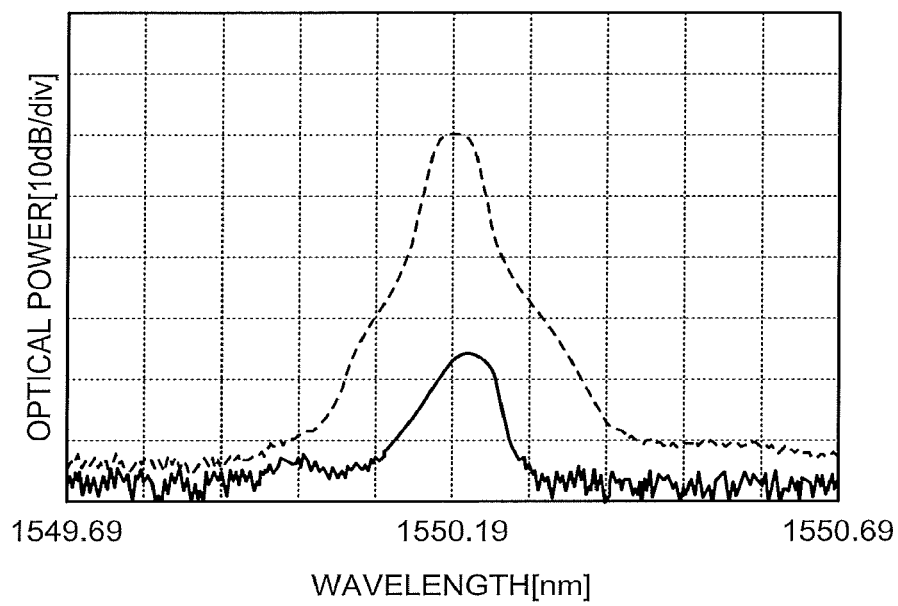
FIG. 22A is a diagram illustrating a comparative example.
FIG. 22B is a diagram illustrating a practical example.

FIGS. 22A, 22B are diagrams illustrating a comparative example and a practical example of the present disclosure, respectively. FIG. 22A illustrates, as a comparative example, a spectrum waveform of seed light (pulsed laser light) when the DFB laser stripe is driven by a direct current to make CW laser oscillation and the pulse width PW2 of the SOA driving current S2 is 1.6 ns in the pulsed laser device that has the configuration illustrated in FIG. 11. FIG. 22B illustrates, as a practical example, a spectrum waveform of seed light (pulsed laser light) when the pulse width of the DFB driving current S1 is 100 ns, and the pulse width PW2 of the SOA driving current S2 is 1.6 ns in the pulsed laser device that has the configuration illustrated in FIG. 11. In the case illustrated in FIG. 22B, it is arranged such that a temporal center of the pulse width PW1 and a temporal center of the pulse width PW2 substantially match with each other as illustrated in FIG. 13. Moreover, in either of FIGS. 22A, 22B, a broken line indicates the SOA driving current S2 is in the ON state, and a solid line indicates that the SOA driving current S2 is in the OFF state. Furthermore, the horizontal axis is for wavelength and the vertical axis is for optical power.

As illustrated in FIGS. 22A, 22B, in the comparative example, there is optical output even when the SOA driving current S2 is in the OFF state as indicated by the solid line. On the other hand, in the practical example, when the SOA driving current S2 is in the OFF state, there is substantially no optical output, and the extinction ratio increases.

In the above embodiments, the modulation pulse width of the DFB driving current S1 is set to be greater than the modulation pulse width of the SOA driving current S2. However, the pulsed laser device according to the present disclosure is not limited thereto. The modulation pulse width of the SOA driving current S2 may be set to be greater than the modulation pulse width of the DFB driving current S1. In this case, there is a case in which a pre-pulse in a surge state as illustrated in FIG. 13 is output from the pulsed laser device; however, it can be suitably applied to a processing target for which pulsed laser light that includes such a pre-pulse in a surge state is preferable.

Moreover, in the above embodiments, the DFB laser device is used as a semiconductor laser device that outputs laser light of a single wavelength, but a Fabry-Perot laser device having an external resonator structure in which the laser oscillation wavelength band is narrowed using a wavelength selective element such as an FBG, a DBR laser device, or a DR laser device may also be used. Furthermore, in the above embodiments, multiple semiconductor laser devices are provided, but only one semiconductor laser device may be provided. Moreover, as a semiconductor laser device, a wavelength-variable semiconductor laser device (for example, refer to Patent Document 7) that uses the Vernier effect may be used, or a wavelength-variable semiconductor laser device of another system may be used. Furthermore, when the pulsed laser device has multiple semiconductor laser devices, at least one out of them may be a wavelength-variable semiconductor laser device.

Moreover, in the above embodiments, an integrated-semiconductor laser device on which all of the semiconductor laser devices, the optical coupler, and the semiconductor optical amplifier are monolithically integrated is used. However, the semiconductor laser device constituting the present disclosure is not limited to this structure. For example, a so-called hybrid integrated-semiconductor laser device in which the semiconductor laser devices and the optical coupler are monolithically integrated to structure one chip, and the semiconductor optical amplifier structures another chip, and these two chips are connected to form a single integrated-semiconductor laser device may be used.

Furthermore, the above embodiments are not intended to limit the present disclosure. A configuration obtained by combining the respective components described above is also included in the present disclosure. Moreover, more effects and modifications can be derived easily by a person skilled in the art. Therefore, a broader aspect of the present disclosure is not limited to the above embodiments, and various modifications may be made.

As described above, the pulsed laser device according to the present disclosure is suitable for applying to, for example, laser processing.

According to the present disclosure, an effect can be obtained that a pulsed laser device capable of outputting pulsed laser light having a favorable pulse waveform can be implemented.

The invention claimed is:

1. A pulsed laser device comprising:
a semiconductor laser device that outputs laser light having a single wavelength;
a semiconductor optical amplifier that receives the laser light output from the semiconductor laser device and amplifies the laser light to output; and
processing circuitry configured to:
supply a pulse-modulated semiconductor-optical-amplifier driving current to the semiconductor optical amplifier by a semiconductor-optical-amplifier driver,
supply a pulse-modulated semiconductor-laser-device driving current to the semiconductor laser device, and the semiconductor-optical-amplifier driver, and
synchronize the pulse modulation of the semiconductor-laser-device driving current with the pulse modulation of the semiconductor-optical-amplifier driving current, by generating time waveforms for the pulse-modulated semiconductor-optical-amplifier driving current and the pulse-modulated semiconductor-laser-device driving current, wherein
a cycle of an ON state and an OFF state of the pulse-modulated semiconductor-optical-amplifier driving current and the pulse-modulated semiconductor-laser-device driving current are matched with each other, and the phase of the pulse modulation currents is such that when pulsed laser light output by the semiconductor laser device is input to the semiconductor optical amplifier, the driving current for the semiconductor optical amplifier in the ON state is supplied to the semiconductor optical amplifier, wherein
the pulse width is equal to or greater than 0.1 ns and less than 1 µs, and
the synchronization is performed by substantially matching temporal centers of the pulse widths.

2. The pulsed laser device according to claim 1, wherein a modulation pulse width of the semiconductor-laser-device driving current is greater than a modulation pulse width of the semiconductor-optical-amplifier driving current.

3. The pulsed laser device according to claim 1, further comprising:
an optical fiber amplifier that receives the laser light output from the semiconductor optical amplifier and amplifies the laser light to output, wherein
the optical fiber amplifier includes an optical amplification fiber that has an optical amplification effect by simulated emission, and a pumping source that outputs pumping light to be supplied to the optical amplification fiber, and
the processing circuitry is further configured to supply a pulse modulated pumping-source driving current to the pumping source, synchronize the pulse modulation of the semiconductor-laser-device driving current, the pulse modulation of the semiconductor-optical-amplifier driving current, with pulse modulation of the pumping-source driving current.

4. The pulsed laser device according to claim 3, wherein a modulation pulse width of the pumping-source driving current is greater than the modulation pulse width of the semiconductor-laser-device driving current and the modulation pulse width of the semiconductor-optical-amplifier driving current.

5. The pulsed laser device according to claim 3, wherein the processing circuitry is further configured to synchronize the pulse modulation of the semiconductor-optical-amplifier driving current with the pulse modulation of the pumping-source driving current such that pulsed laser light output from the semiconductor optical amplifier is input to the optical fiber amplifier in a latter half of a period of a pumped state in the optical fiber amplifier.

6. The pulsed laser device according to claim 3, wherein the processing circuitry is further configured to synchronize the pulse modulation of the semiconductor-optical-amplifier driving current with the pulse modulation of the pumping-source driving current such that a pumped state in the optical fiber amplifier is turned into an OFF state at substantially a same time when a state of pulsed laser light output from the semiconductor optical amplifier becomes an OFF state.

7. The pulsed laser device according to claim 3, wherein the processing circuitry is further configured to perform control such that the modulation pulse width of the pumping-source driving current is longer than a relaxation time of the optical fiber amplifier.

8. The pulsed laser device according to claim 3, wherein the processing circuitry is further configured to perform control such that as the modulation pulse width of the pumping-source driving current decreases, the pumping-source driving current increases.

9. The pulsed laser device according to claim 3, wherein the processing circuitry is further configured to perform control such that when relaxation time of the optical fiber amplifier is longer than a period of an OFF state in pulses of the pumping-source driving current, a pumping-source driver supplies a pumping-source driving current of a direct current of a predetermined value to the pumping source.

10. The pulsed laser device according to claim 3, further comprising:
an optical bandpass filter that is disposed in a subsequent stage of the optical fiber amplifier, and that selectively passes light having a wavelength of the laser light output from the semiconductor laser device.

11. The pulsed laser device according to claim 1, further comprising:
an optical fiber amplifier that receives the laser light output from the semiconductor optical amplifier and amplifies the laser light to output.

12. The pulsed laser device according to claim 3, further comprising:
a booster optical-fiber amplifier that is disposed in a subsequent stage of the optical fiber amplifier, and that receives the laser light output from the optical fiber amplifier and amplifies the laser light to output.

13. The pulsed laser device according to claim 12, wherein
the booster optical-fiber amplifier includes an effective-mode cross-section expander that expands an effective-mode cross-sectional area of the received laser light, and an effective-mode cross-section expanding optical-amplification fiber that amplifies laser light that is expanded the effective-mode cross-section area, while propagating in a single mode in a state that the effective-mode cross-sectional area has been expanded.

14. The pulsed laser device according to claim 13, wherein
the effective-mode cross-section expander converts a propagation mode of the received laser light propagated in a fundamental mode into a higher order mode, and the effective-mode cross-section expanding optical-amplification fiber amplifies the laser light in the higher order mode while propagating in the single mode.

15. The pulsed laser device according to claim 14, wherein
the booster optical-fiber amplifier further includes an effective-mode cross-section reducer that converts the propagation mode of the laser light in the higher order mode that has been amplified by the effective-mode cross-section expanding optical-amplification fiber into the fundamental mode.

16. The pulsed laser device according to claim 13, wherein
the effective-mode cross-section expander converts a propagation mode of the received laser light propagated in a fundamental mode of the optical fiber into a multimode, and
the effective-mode cross-section expanding optical-amplification fiber leaks components of a higher order mode out of the laser light in the multimode, and amplifies components of the fundamental mode while propagating in the single mode.

17. The pulsed laser device according to claim 1, further comprising:
a plurality of semiconductor laser devices that output laser light beams having wavelengths different from each other; and
an optical coupler that couples the laser light beams output by the semiconductor laser devices to output to the semiconductor optical amplifier.

18. The pulsed laser device according to claim 17, wherein
the semiconductor laser devices, the optical coupler, and the semiconductor optical amplifier are monolithically integrated to form an integrated-semiconductor laser device.

19. The pulsed laser device according to claim 17, wherein the processing circuitry is further configured to:
supply a driving current to the semiconductor laser devices; and
the pulsed laser device pulsed laser device further comprises a plurality of switches that switch between supply and stop of a driving current to the semiconductor laser devices from a semiconductor-laser-device driver.

20. The pulsed laser device according to claim 17, wherein the processing circuitry is further configured to supply driving currents to the semiconductor laser devices.

21. The pulsed laser device according to claim 1, wherein the semiconductor laser device is a wavelength-variable semiconductor-laser device.

22. The pulsed laser device according to claim 1, wherein a wavelength of the laser light output from the semiconductor laser device is adjusted by varying an amount of a driving current to be supplied to the semiconductor laser device.

23. The pulsed laser device according to claim 1, further comprising:
a monitor that monitors a power of a part of the laser light output from the semiconductor optical amplifier; and
a constant-output controller that controls the semiconductor-optical-amplifier driver such that a power of the laser light output from the semiconductor optical amplifier is constant, based on a result of monitoring by the monitor.

24. A method for producing a pulsed laser illumination comprising:
outputting laser light having a single wavelength by a semiconductor laser device;
amplifying the laser light by a semiconductor optical amplifier that receives the laser light from the semiconductor laser device to output;
supplying a pulse-modulated semiconductor optical amplifier driving current to the semiconductor optical amplifier by a semiconductor optical amplifier driver;
supplying a pulse-modulated semiconductor laser device driving current to the semiconductor laser device and the semiconductor optical amplifier driver; and
synchronizing pulse modulation of the semiconductor laser device driving current with pulse modulation of the semiconductor optical amplifier driving current, wherein
the pulse width is equal to or greater than 0.1 ns and less than 1 µs, and the synchronization is performed by substantially matching temporal centers of the pulse widths.

\* \* \* \* \*

UNITED STATES PATENT AND TRADEMARK OFFICE
CERTIFICATE OF CORRECTION

PATENT NO. : 10,534,128 B2  
APPLICATION NO. : 15/836023  
DATED : January 14, 2020  
INVENTOR(S) : Eisuke Otani Page 1 of 1

It is certified that error appears in the above-identified patent and that said Letters Patent is hereby corrected as shown below:

On the Title Page

Item (30), the Foreign Application Priority Data is incorrect. Item (30) should read:
-- (30) Foreign Application Priority Data
Jun. 10, 2015 (JP) ........................ 2015-117792
Sep. 9, 2012 (JP) ........................ 2015-177273 --

Signed and Sealed this  
Third Day of March, 2020

Andrei Iancu  
*Director of the United States Patent and Trademark Office*